US010658203B2

(12) United States Patent
Tsujikawa et al.

(10) Patent No.: US 10,658,203 B2
(45) Date of Patent: May 19, 2020

(54) SUBSTRATE PROCESSING APPARATUS AND PROCESSING CUP CLEANING METHOD

(71) Applicant: SCREEN Holdings Co., Ltd., Kyoto (JP)

(72) Inventors: Hiroki Tsujikawa, Kyoto (JP); Masahide Ikeda, Kyoto (JP); Atsuyasu Miura, Kyoto (JP); Kazuhiro Fujita, Kyoto (JP); Yuya Tsuchihashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/648,900

(22) Filed: Jul. 13, 2017

(65) Prior Publication Data

US 2018/0025922 A1 Jan. 25, 2018

(30) Foreign Application Priority Data

Jul. 19, 2016 (JP) ................. 2016-141463

(51) Int. Cl.
*H01L 21/67* (2006.01)
*B08B 3/04* (2006.01)
*B08B 3/10* (2006.01)
*B08B 3/08* (2006.01)

(52) U.S. Cl.
CPC ........ *H01L 21/67051* (2013.01); *B08B 3/048* (2013.01); *B08B 3/08* (2013.01); *B08B 3/10* (2013.01); *H01L 21/67017* (2013.01)

(58) Field of Classification Search
CPC .. B08B 3/048; B08B 3/08; B08B 3/10; H01L 21/67017; H01L 21/67051
See application file for complete search history.

(56) References Cited

U.S. PATENT DOCUMENTS

2004/0050491 A1* 3/2004 Miya ...................... B08B 17/00
156/345.11
2004/0261817 A1* 12/2004 Araki ................ H01L 21/67051
134/2

(Continued)

FOREIGN PATENT DOCUMENTS

JP H11-317386 A 11/1999
JP 2003-282417 A 10/2003

(Continued)

*Primary Examiner* — Benjamin L Osterhout
(74) *Attorney, Agent, or Firm* — Ostrolenk Faber LLP

(57) ABSTRACT

A substrate processing apparatus includes a guard that catches liquid scattered outward from a spin chuck, a cup defining a liquid receiving groove to catch liquid that is guided downward by the guard, a guard elevating/lowering unit that moves the guard in an up/down direction, a cleaning liquid supplying unit that supplies cleaning liquid, discharged from a cleaning liquid nozzle, to the liquid receiving groove via the spin chuck and the guard, a cleaning liquid draining unit that drains the cleaning liquid in the liquid receiving groove, and a controller that controls the cleaning liquid supplying unit and the cleaning liquid draining unit to accumulate cleaning liquid in the liquid receiving groove and controls the guard elevating/lowering unit to cause a lower end portion of the cylindrical portion to be immersed in the cleaning liquid in the liquid receiving groove.

13 Claims, 11 Drawing Sheets

(56) References Cited

U.S. PATENT DOCUMENTS

| | | | |
|---|---|---|---|
| 2005/0115671 A1* | 6/2005 | Araki | B08B 7/04 |
| | | | 156/345.12 |
| 2008/0142051 A1 | 6/2008 | Hashizume | 134/23 |
| 2009/0320885 A1 | 12/2009 | Inoue et al. | 134/104.2 |
| 2010/0032097 A1* | 2/2010 | Ohashi | H01L 21/67034 |
| | | | 156/345.55 |
| 2010/0212701 A1 | 8/2010 | Nanba et al. | 134/95.1 |
| 2012/0192899 A1 | 8/2012 | Higashijima | 134/22.1 |
| 2013/0014787 A1* | 1/2013 | Urata | H01L 21/6708 |
| | | | 134/100.1 |
| 2015/0040951 A1 | 2/2015 | Yoshizumi et al. | 134/26 |
| 2016/0045938 A1 | 2/2016 | Aomatsu et al. | |

FOREIGN PATENT DOCUMENTS

| | | |
|---|---|---|
| JP | 2006-024793 A | 1/2006 |
| JP | 2009-027188 A | 2/2009 |
| JP | 2012-178544 A | 9/2012 |
| JP | 2017-034121 A | 2/2017 |
| KR | 10-2015-0018383 A | 2/2015 |
| KR | 10-2016-0021042 A | 2/2016 |
| TW | 200832587 A | 8/2008 |
| TW | 200910494 A | 3/2009 |
| TW | 201517998 A | 5/2015 |
| TW | 201613016 A | 4/2016 |

\* cited by examiner

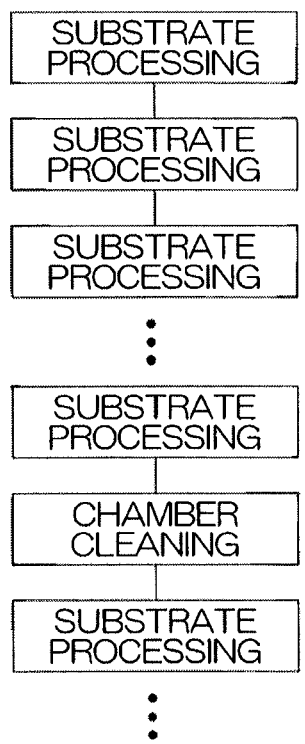
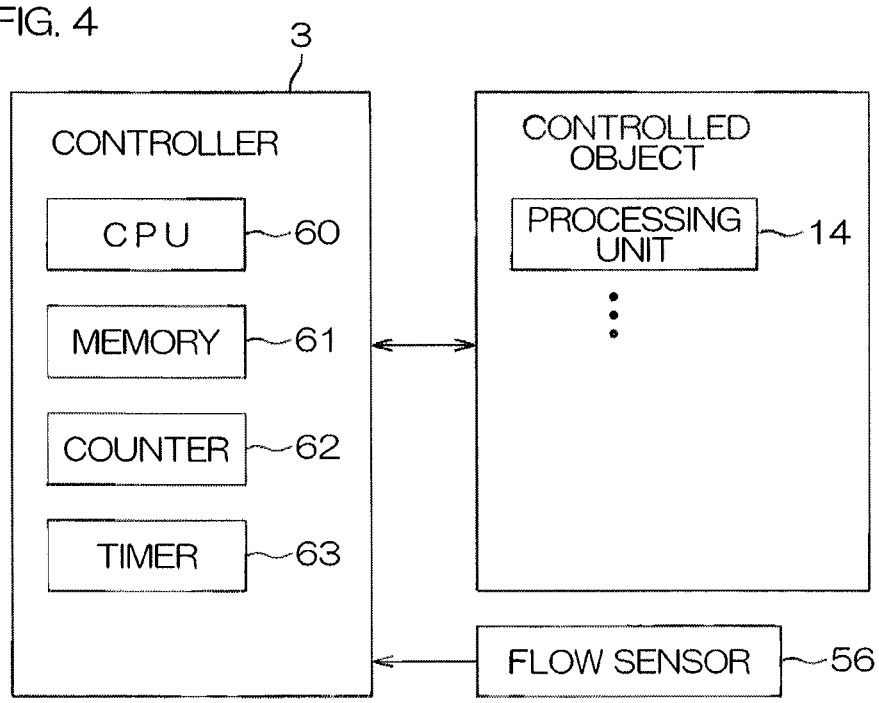

CHEMICAL LIQUID SUPPLYING

RINSE LIQUID SUPPLYING

DRYING

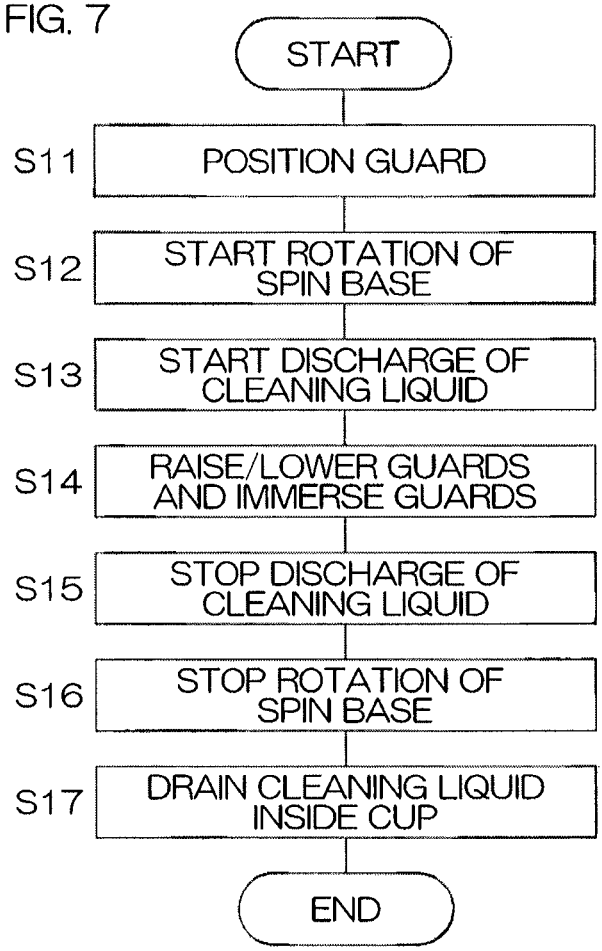

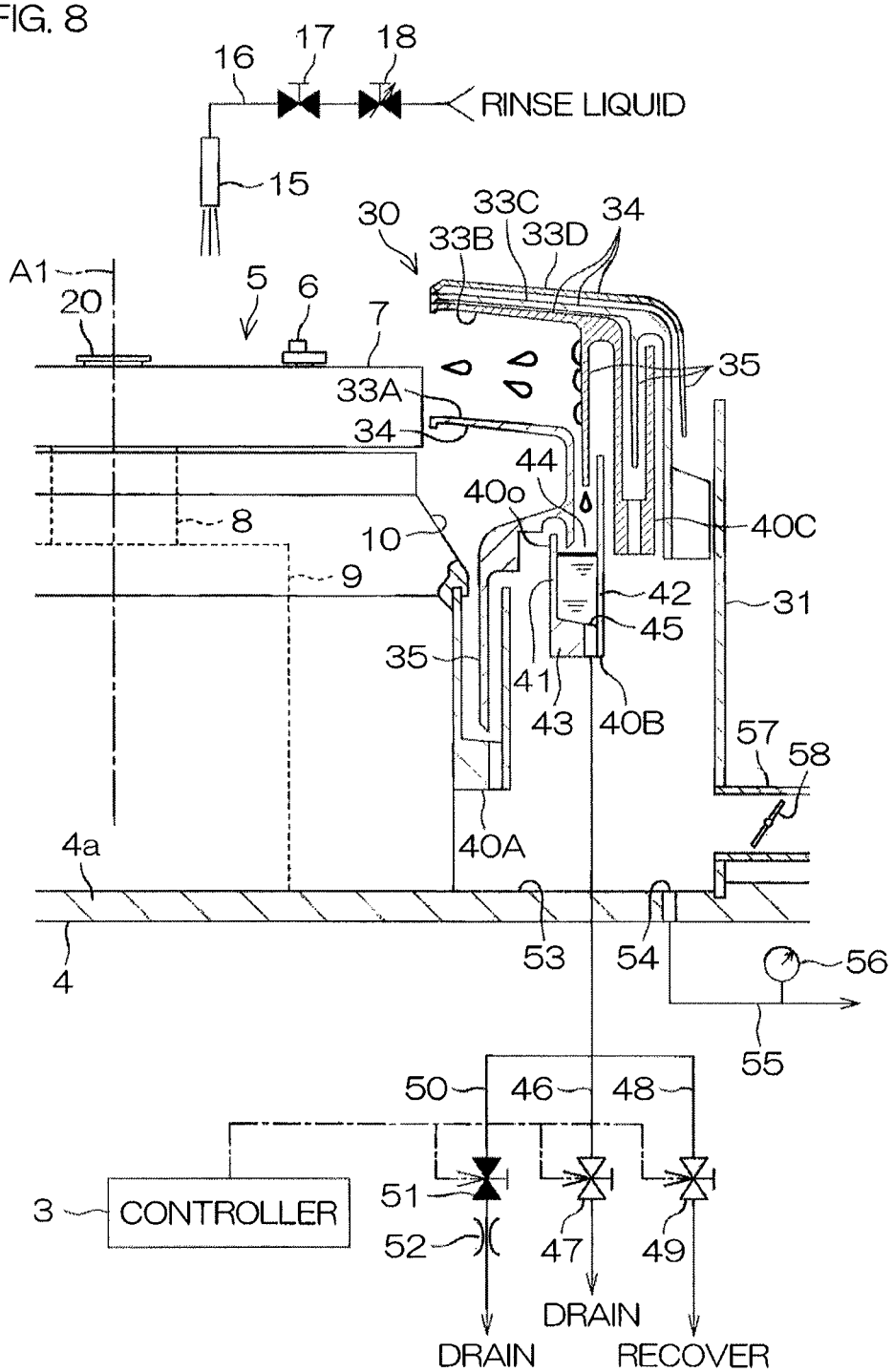

SUBSTRATE PROCESSING APPARATUS AND PROCESSING CUP CLEANING METHOD

BACKGROUND OF THE INVENTION

1. Field of the Invention

The present invention relates to a substrate processing apparatus including a processing cup that includes a guard and a cup, and a processing cup cleaning method that cleans the processing cup.

Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In a manufacturing process for a semiconductor device or a liquid crystal display device, etc., a substrate processing apparatus is used to process substrates, such as semiconductor wafers, glass substrates for liquid crystal display devices, etc. US2009320885 A1 discloses a single substrate processing type substrate processing apparatus that processes substrates one by one.

This substrate processing apparatus includes a spin chuck, rotating a substrate around a vertical rotational axis, passing through a central portion of the substrate, while holding it horizontally, a processing liquid nozzle, discharging a processing liquid toward an upper surface of the substrate held by the spin chuck, a cylindrical processing cup, surrounding the spin chuck, and an exhaust pipe, exhausting a gas in the processing cup.

The processing cup includes a plurality of guards, catching the processing liquid expelled outward from the spin chuck, and a plurality of cups, respectively catching the processing liquid guided downward by the plurality of guards. Each guard includes a cylindrical portion, surrounding the spin chuck, and a ceiling portion, extending obliquely upward toward the rotational axis from an upper end portion of the cylindrical portion. Each cup includes an annular bottom wall portion, surrounding the spin chuck, an inner wall portion, extending upward from an inner peripheral portion of the bottom wall portion, and an outer wall portion, extending upward from an outer peripheral portion of the bottom wall portion. The bottom wall portion, the inner wall portion, and the outer wall portion define an annular liquid receiving groove that is open upward. A lower end portion of the guard is positioned above the liquid receiving groove.

The processing liquid discharged from the processing liquid nozzle lands on an upper surface of the rotating substrate and thereafter flows outward along the upper surface of the substrate. The processing liquid that reaches an outer peripheral portion of the substrate scatters from the substrate to its periphery and is caught by the guards. The processing liquid caught by the guards flows downward along inner peripheral surfaces of the cylindrical portions of the guards and flow down into the liquid receiving grooves of the cups. The processing liquid in the cups is drained from the bottom wall portions of the cup. Also, a gas in the processing cup is exhausted to the exhaust pipe upon passing upward through gaps between the cylindrical portions of the guards and the outer wall portions of the cups.

The processing liquid, such as a chemical liquid, etc., remains on inner surfaces of the guards. The guards are thus cleaned at an appropriate timing. The cleaning of the guards is performed, for example, by making the processing liquid nozzle discharge pure water toward the spin chuck that is rotating in a state where a substrate is not held by the spin chuck. The pure water discharged from the processing liquid nozzle is supplied to the guards via the spin chuck and flow downward along the inner peripheral surfaces of the cylindrical portions of the guards. The pure water is thereby supplied directly to the inner peripheral surfaces of the cylindrical portions and the inner peripheral surfaces of the cylindrical portions are cleaned.

However, the pure water that flows downward along the inner peripheral surfaces of the cylindrical portions of the guards falls from lower ends of the cylindrical portions and it is thus unlikely for the pure water to directly contact lower surfaces and outer peripheral surfaces of the cylindrical portions. Although a chemical liquid flowing downward along the inner peripheral surfaces of the cylindrical portions is also unlikely to directly contact these portions (portions indicated by thick alternate long and short dashes lines in FIG. 13), a mist or liquid droplets of the chemical liquid may contact these portions. Especially with the substrate processing apparatus of US2009320885 A1, exhaust passes upward through the gaps between the cylindrical portions of the guards and the outer wall portions of the cups (see arrows shown in FIG. 13) and therefore the chemical liquid is likely to attach to outer peripheral surfaces of lower end portions of the cylindrical portions. There are thus cases where minute amounts of the chemical liquid remain on the lower surfaces and the outer peripheral surfaces of the cylindrical portions. When such a chemical liquid dries, crystals of the chemical liquid remain on the corresponding portions.

SUMMARY OF THE INVENTION

A preferred embodiment of the present invention provides a substrate processing apparatus including a substrate holding unit, rotating a substrate around a vertical rotational axis passing through a central portion of the substrate while holding the substrate horizontally, a chemical liquid nozzle, discharging a chemical liquid toward the substrate held by the substrate holding unit, a guard of cylindrical shape, including a cylindrical portion that surrounds the substrate held by the substrate holding unit and catching liquid scattered outward from the substrate holding unit, a cup of annular shape, defining a liquid receiving groove of annular shape positioned below the cylindrical portion and catching liquid, guided downward by the guard, by the liquid receiving groove, a guard elevating/lowering unit, moving the guard in an up/down direction, a cleaning liquid supplying unit, including a first cleaning liquid nozzle that discharges a cleaning liquid, differing from the chemical liquid, from a discharge port disposed above or below the substrate held by the substrate holding unit, and supplying the cleaning liquid, discharged from the first cleaning liquid nozzle, to the liquid receiving groove via the substrate holding unit and the guard, a cleaning liquid draining unit, draining the cleaning liquid, in the liquid receiving groove, via a drain port provided in the liquid receiving groove, a liquid amount control unit, controlling the cleaning liquid supplying unit and the cleaning liquid draining unit to accumulate the cleaning liquid in the liquid receiving groove, and a guard position control unit, controlling the guard elevating/lowering unit to cause a lower end portion of the cylindrical portion to be immersed in the cleaning liquid in the liquid receiving groove.

With the present arrangement, the chemical liquid discharged from the chemical liquid nozzle lands on the rotating substrate and flows outward along the substrate. The chemical liquid expelled outward from the substrate is caught by the cup via the guard. Thereafter, the cleaning liquid discharged from the first cleaning liquid nozzle lands on the rotating substrate holding unit and flows outward along the substrate holding unit. The cleaning liquid expelled outward from the substrate holding unit is caught by the cylindrical portion of the guard and flows downward along an inner peripheral surface of the cylindrical portion. Liquid droplets of the chemical liquid are thereby removed from an inner surface of the guard, including the inner peripheral surface of the cylindrical portion, and the inner surface of the guard is cleaned.

The cleaning liquid flowing downward along the inner surface of the guard flows down into the liquid receiving groove of the cup. When the substrate is processed, the liquid in the liquid receiving groove is drained via the drain port provided in the liquid receiving groove. However, when the guard is to be cleaned, the cleaning liquid is accumulated in the liquid receiving groove. Thereafter, the lower end portion of the cylindrical portion is immersed in the cleaning liquid in the liquid receiving groove. Not just the inner peripheral surface of the lower end portion of the cylindrical portion but a lower surface and an outer peripheral surface of the lower end portion of the cylindrical portion are also put in direct contact with the cleaning liquid in the liquid receiving groove thereby. The chemical liquid of minute amount and crystals of the chemical liquid are thus removed from the lower surface and the outer peripheral surface of the lower end portion of the cylindrical portion and the lower end portion of the cylindrical portion is cleaned. Contaminants remaining on the guard can thereby be lessened.

In the preferred embodiment, at least one of the following features may be added to the substrate processing apparatus.

The guard position control unit causes the lower end portion of the cylindrical portion to vibrate in the up/down direction while causing the lower end portion of the cylindrical portion to be immersed in the cleaning liquid in the liquid receiving groove.

With the present arrangement, the lower end portion of the cylindrical portion of the guard moves in the up-direction inside the cleaning liquid in the liquid receiving groove. The chemical liquid of minute amount and the crystals of the chemical liquid that are attached to the lower end portion of the cylindrical portion can thereby be removed effectively.

The guard position control unit causes the guard to reciprocate a plurality of times in the up/down direction between a cleaning upper position, at which the lower end portion of the cylindrical portion is positioned above the cleaning liquid in the liquid receiving groove, and a cleaning lower position, at which the lower end portion of the cylindrical portion is immersed in the cleaning liquid in the liquid receiving groove.

With the present arrangement, the lower end portion of the cylindrical portion passes through a surface (upper surface) of the cleaning liquid in the liquid receiving groove a plurality of times in the up/down direction. When the lower end portion of the cylindrical portion exits upward from the surface of the cleaning liquid, a surface tension of the cleaning liquid pulls down the crystals of the chemical liquid attached to the lower end portion of the cylindrical portion. Also, when the lower end portion of the cylindrical portion enters the surface of the cleaning liquid, an impact is applied to the crystals of the chemical liquid attached to the lower end portion of the cylindrical portion. The crystals of the chemical liquid can thus be removed effectively from the lower end portion of the cylindrical portion.

The liquid amount control unit causes the cleaning liquid in the liquid receiving groove to be drained via the drain port when the lower end portion of the cylindrical portion is immersed in the cleaning liquid in the liquid receiving groove.

With the present arrangement, the cleaning liquid in the liquid receiving groove is drained via the drain port while the lower end portion of the cylindrical portion is immersed in the cleaning liquid in the liquid receiving groove. The chemical liquid and the crystals of the chemical liquid removed from the lower end portion of the cylindrical portion move out of the liquid receiving groove together with the cleaning liquid drained from the liquid receiving groove via the drain port. The chemical liquid and the crystals of the chemical liquid are thus unlikely to reattach to the lower end portion of the cylindrical portion. Contaminants remaining on the guard can thereby be lessened.

At least either when the lower end portion of the cylindrical portion is immersed in the cleaning liquid in the liquid receiving groove or when the lower end portion of the cylindrical portion is not immersed in the cleaning liquid in the liquid receiving groove, the liquid amount control unit causes the cleaning liquid in the liquid receiving groove to overflow from an entrance of the liquid receiving groove.

With the present arrangement, the cleaning liquid in the liquid receiving groove overflows from the entrance of the liquid receiving groove provided at an upper end of the liquid receiving groove. When the lower end portion of the cylindrical portion is immersed in the cleaning liquid in the liquid receiving groove, the chemical liquid and the crystals of the chemical liquid are mixed in the cleaning liquid in the liquid receiving groove. The chemical liquid, etc., present near the surface of the cleaning liquid in the liquid receiving groove are drained out of the liquid receiving groove together with the cleaning liquid overflowing from the liquid receiving groove. The chemical liquid and the crystals of the chemical liquid are therefore unlikely to reattach to the lower end portion of the cylindrical portion. Contaminants remaining on the guard can thereby be lessened.

The liquid amount control unit causes the cleaning liquid in the liquid receiving groove to overflow from the entrance of the liquid receiving groove when the lower end portion of the cylindrical portion is rising inside the cleaning liquid in the liquid receiving groove.

A volume of the portion of the cylindrical portion that is inside the cleaning liquid decreases when the lower end portion of the cylindrical portion is rising inside the cleaning liquid and therefore the surface of the cleaning liquid will continue to be lowered unless the cleaning liquid is supplied to the liquid receiving groove. With the present arrangement, the cleaning liquid is supplied to the liquid receiving groove at a high flow rate such that the cleaning liquid overflows from the liquid receiving groove even in such a case. The chemical liquid, etc., mixed in the cleaning liquid in the liquid receiving groove can thus be drained reliably together with the cleaning liquid overflowing from the liquid receiving groove.

The cup includes an outer surface downwardly guiding the cleaning liquid that overflowed from the entrance of the liquid receiving groove.

With the present arrangement, the cleaning liquid that overflowed from the liquid receiving groove flows downward along the outer surface of the cup that includes an inner peripheral surface of an inner wall portion and an outer peripheral surface of an outer wall portion. Although the chemical liquid used for processing the substrate is unlikely to directly contact the outer surface of the cup, a mist or liquid droplets of the chemical liquid may contact the outer surface of the cup. Therefore, by making the cleaning liquid contact the outer surface of the cup directly, the chemical liquid and the crystals of the chemical liquid attached to the outer surface of the cup can be removed.

The substrate processing apparatus further includes a vat, positioned below the cup and catching the cleaning liquid that overflowed from the entrance of the liquid receiving groove, a lower drain piping, guiding the cleaning liquid, drained from the vat via a lower drain port provided in the vat, and a flow sensor, detecting a flow rate of a liquid flowing through the lower drain piping, and the liquid amount control unit judges, based on a detection value of the flow sensor, whether or not the cleaning liquid overflowed from the liquid receiving groove.

With the present arrangement, the cleaning liquid that overflowed from the cup is caught by the vat, positioned below the cup, and is drained from the vat into the lower drain piping via the lower drain port. When the cleaning liquid overflows from the liquid receiving groove of the cup, the flow rate of the liquid flowing through the lower drain piping changes. Whether or not the cleaning liquid overflowed from the liquid receiving groove is judged based on the detection value of the flow sensor that detects the flow rate of the liquid flowing through the lower drain piping. The cleaning liquid overflowed from the liquid receiving groove can thus be detected reliably.

The cleaning liquid draining unit decreases a drain flow rate that represents a flow rate of the cleaning liquid drained from the liquid receiving groove via the drain port, to make the drain flow rate less than a supply flow rate that represents a flow rate of the cleaning liquid supplied from the first cleaning liquid nozzle to the liquid receiving groove via the substrate holding unit and the guard.

With the present arrangement, the drain flow rate is changed from a value greater than the supply flow rate to a value (including zero) less than the supply flow rate. The cleaning liquid can thereby be accumulated in the cup reliably.

The cleaning liquid draining unit includes an ordinary piping, guiding the cleaning liquid drained from the liquid receiving groove via the drain port, a restriction piping, guiding the cleaning liquid drained from the liquid receiving groove via the drain port, a constricted portion, interposed in the restriction piping and having a flow passage area smaller than a minimum value of a flow passage area of the ordinary piping, and a drain switching valve, switched between an ordinary state, in which the cleaning liquid in the liquid receiving groove is drained into the ordinary piping, and a restriction state, in which the cleaning liquid in the liquid receiving groove is drained into the restriction piping.

With the present arrangement, the drain switching valve is switched from the ordinary state to the restriction state to accumulate the cleaning liquid in the cup. The cleaning liquid in the liquid receiving groove is drained, not into the ordinary piping, but into the restriction piping. The flow passage area of the constricted portion interposed in the restriction piping is smaller than the minimum value of the flow passage area of the ordinary piping. The drain flow rate is thereby made less than the supply flow rate and the cleaning liquid accumulates in the cup.

The cleaning liquid draining unit includes an ordinary piping, guiding the cleaning liquid drained from the liquid receiving groove via the drain port, and a drain flow control valve, changing a flow rate of a liquid flowing in the ordinary piping.

With the present arrangement, an opening degree of the drain flow control valve, which changes the flow rate of the liquid flowing in the ordinary piping, is decreased to accumulate the cleaning liquid in the cup. The cleaning liquid in the liquid receiving groove is drained into the ordinary piping. The drain flow rate is thereby made less than the supply flow rate and the cleaning liquid accumulates in the cup.

The cleaning liquid supplying unit increases a supply flow rate that represents a flow rate of the cleaning liquid supplied from the first cleaning liquid nozzle to the liquid receiving groove via the substrate holding unit and the guard, to make the supply flow rate greater than a drain flow rate that represents a flow rate of the cleaning liquid drained from the liquid receiving groove via the drain port.

With the present arrangement, the supply flow rate is changed from a value less than the drain flow rate to a value greater than the drain flow rate. The cleaning liquid can thereby be accumulated in the liquid receiving groove reliably.

The cleaning liquid supplying unit includes a supply piping, guiding the cleaning liquid to be supplied to the first cleaning liquid nozzle, and a supply flow control valve, changing a flow rate of a liquid flowing in the supply piping.

With the present arrangement, an opening degree of the supply flow control valve, which changes the flow rate of the liquid flowing in the supply piping, is increased to accumulate the cleaning liquid in the cup. The cleaning liquid is supplied to the first cleaning liquid nozzle from the supply piping and is discharged from the first cleaning liquid nozzle. The supply flow rate is thereby made greater than the drain flow rate and the cleaning liquid accumulates in the cup.

The cleaning liquid supplying unit includes a second cleaning liquid nozzle differing from the first cleaning liquid nozzle and discharging a cleaning liquid from a discharge port disposed above or below the substrate held by the substrate holding unit.

With the present arrangement, the cleaning liquid is discharged not only by the first cleaning liquid nozzle but also by the second cleaning liquid nozzle. The cleaning liquid discharged from the first cleaning liquid nozzle and the second cleaning liquid nozzle is supplied to the liquid receiving groove of the cup via the substrate holding unit and the guard. The supply flow rate is thereby made greater than the drain flow rate and the cleaning liquid accumulates in the cup.

Another preferred embodiment of the present invention provides a processing cup cleaning method, including a chemical liquid supplying step of horizontally holding a substrate, rotating the substrate around a vertical rotational axis passing through a central portion of the substrate and discharging a chemical liquid toward the substrate, a first liquid receiving step of causing the chemical liquid, expelled outward from the substrate, to be caught by a guard that includes a cylindrical portion surrounding the substrate, a first supplying step of causing the chemical liquid, guided downward by the guard, to be caught by a cup, defining a liquid receiving groove of annular shape that is positioned below the cylindrical portion, and meanwhile draining the chemical liquid in the liquid receiving groove via a drain port provided in the liquid receiving groove, a cleaning liquid discharging step of causing a spin base, disposed under the substrate, to rotate around the rotational axis after the chemical liquid supplying step and meanwhile causing a first cleaning liquid nozzle to discharge a cleaning liquid, differing from the chemical liquid, above the spin base, a second liquid receiving step of causing the cleaning liquid, expelled outward from the spin base, to be caught by the guard, a second supplying step of causing the cleaning liquid, guided downward by the guard, to be caught by the liquid receiving groove of the cup, an accumulating step of accumulating the cleaning liquid in the liquid receiving groove by making a supply flow rate that represents a flow rate of the cleaning liquid supplied from the first cleaning liquid nozzle to the liquid receiving groove via the spin base and the guard, greater than a drain flow rate that represents a flow rate of the cleaning liquid drained from the liquid receiving groove via the drain port, and an immersing step of lowering the guard to immerse a lower end portion of the cylindrical portion in the cleaning liquid in the liquid receiving groove. By the present arrangement, the same effects as the effects described above can be exhibited.

In the preferred embodiment, at least one of the following features may be added to the processing cup cleaning method.

The immersing step is a processing cup cleaning method according to claim 15 that includes a step of causing the lower end portion of the cylindrical portion to vibrate in the up/down direction while causing the lower end portion of the cylindrical portion to be immersed in the cleaning liquid in the liquid receiving groove. By the present arrangement, the same effects as the effects described above can be exhibited.

The immersing step includes a step of causing the guard to reciprocate a plurality of times in an up/down direction between a cleaning upper position, at which the lower end portion of the cylindrical portion is positioned above the cleaning liquid in the liquid receiving groove, and a cleaning lower position, at which the lower end portion of the cylindrical portion is immersed in the cleaning liquid in the liquid receiving groove. By the present arrangement, the same effects as the effects described above can be exhibited.

The accumulating step includes a step of causing the cleaning liquid in the liquid receiving groove to be drained via the drain port when the lower end portion of the cylindrical portion is immersed in the cleaning liquid in the liquid receiving groove. By the present arrangement, the same effects as the effects described above can be exhibited.

The accumulating step includes a step of causing the cleaning liquid in the liquid receiving groove to overflow from an entrance of the liquid receiving groove at least either when the lower end portion of the cylindrical portion is immersed in the cleaning liquid in the liquid receiving groove or when the lower end portion of the cylindrical portion is not immersed in the cleaning liquid in the liquid receiving groove. By the present arrangement, the same effects as the effects described above can be exhibited.

The accumulating step includes a step of causing the cleaning liquid in the liquid receiving groove to overflow from the entrance of the liquid receiving groove when the lower end portion of the cylindrical portion is rising inside the cleaning liquid in the liquid receiving groove. By the present arrangement, the same effects as the effects described above can be exhibited.

The accumulating step includes a step of causing the cleaning liquid, which overflowed from the entrance of the liquid receiving groove, to flow down along an outer surface of the cup. By the present arrangement, the same effects as the effects described above can be exhibited.

The processing cup cleaning method further includes a step of causing the cleaning liquid, which overflowed from the entrance of the liquid receiving groove, to be caught by a vat positioned below the cup, a step of draining the cleaning liquid in the vat into a lower drain piping via a lower drain port provided in the vat, and a step of judging, based on a flow rate of a liquid flowing in the lower drain piping, whether or not the cleaning liquid overflowed from the liquid receiving groove. By the present arrangement, the same effects as the effects described above can be exhibited.

The accumulating step makes the supply flow rate greater than the drain flow rate by executing at least either a decreasing of the drain flow rate or an increasing of the supply flow rate. By the present arrangement, the same effects as the effects described above can be exhibited.

The foregoing and other objects, features and advantages of the present invention will become more apparent from the description of preferred embodiments provided below with reference to the accompanying drawings.

BRIEF DESCRIPTION OF THE DRAWINGS

FIG. 3 is a schematic view showing an outline of processing executed at the substrate processing apparatus.

FIG. 4 is a block diagram for describing an electrical arrangement of the substrate processing apparatus.

FIG. 7 is a process flowchart for describing an example of chamber cleaning by which an interior of the processing unit is cleaned.

FIG. 8 is a schematic view showing a state where pure water, which is an example of a cleaning liquid, is accumulated in a second cup.

DETAILED DESCRIPTION OF PREFERRED EMBODIMENTS

Figure 1:
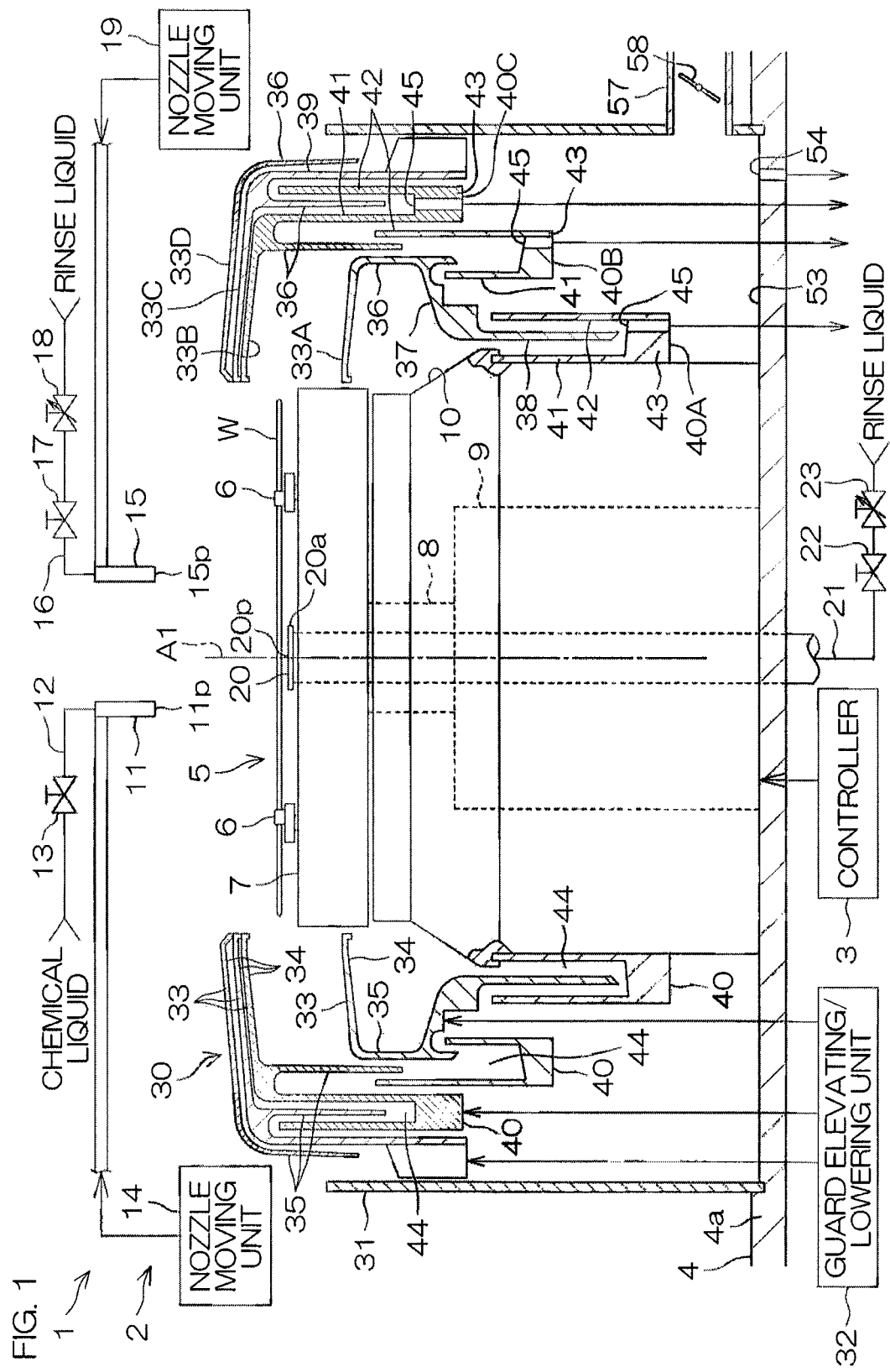
FIG. 1 is a schematic partial sectional view of an interior of a processing unit included in a substrate processing apparatus according to a preferred embodiment of the present invention as viewed horizontally.
Figure 2:
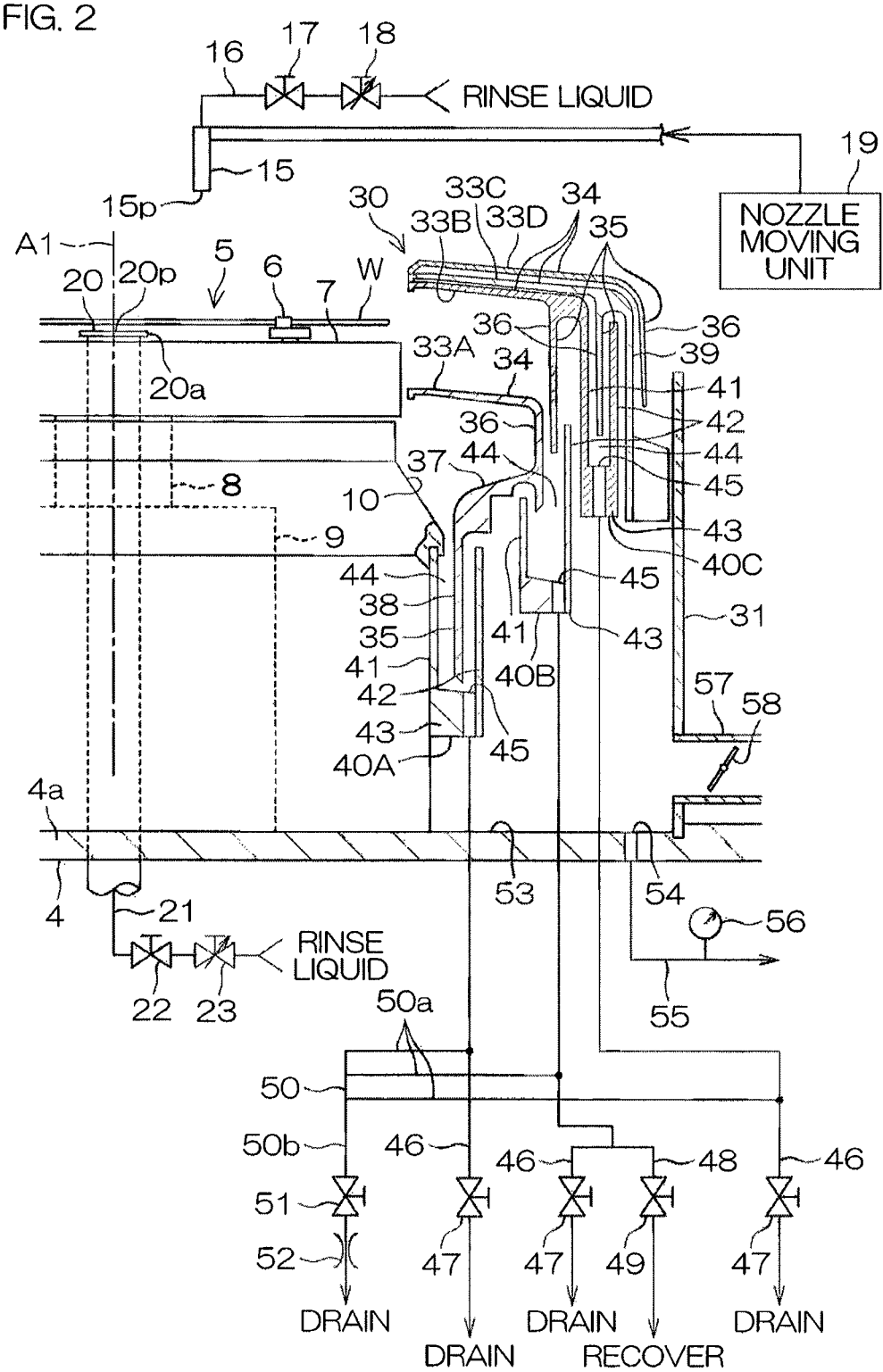
FIG. 2 is a schematic partial sectional view for describing a draining system that drains a liquid in a processing cup.

FIG. 1 is a schematic view of a general arrangement of a substrate processing apparatus 1 according to a preferred embodiment of the present invention. FIG. 2 is a schematic partial sectional view for describing a draining system that drains a liquid in a processing cup 30.

The substrate processing apparatus 1 is a single substrate processing type apparatus that processes disk-shaped substrates W, such as semiconductor wafers, etc., one at a time. As shown in FIG. 1, the substrate processing apparatus 1 includes a processing unit 2, processing a substrate W by a processing fluid, such as processing liquid or a processing gas, etc., a transfer robot (not shown) that transfers the substrate W to the processing unit 2, and a controller 3, controlling the substrate processing apparatus 1.

The processing unit 2 includes a box-shaped chamber 4, having an internal space, a spin chuck 5, rotating the single substrate W around a vertical rotational axis A1, passing through a central portion of the substrate W, while holding it horizontally inside the processing chamber 4, a plurality of nozzles, discharging various types of fluids toward the substrate W held by the spin chuck 5, and a processing cup 30 of cylindrical shape, catching a processing liquid expelled outward from the spin chuck 5.

The spin chuck 5 is an example of a substrate holding unit. The spin chuck 5 includes a disk-shaped spin base 7 that is held horizontally, a plurality of chuck pins 6, holding the substrate W horizontally at a substrate holding position above the spin base 7, and a chuck opening/closing mechanism (not shown) that opens and closes the plurality of chuck pins 6. The spin chuck 5 further includes a spin shaft 8, extending downward along the rotational axis A1 from a central portion of the spin base 7, a spin motor 9, rotating the spin shaft 8 to rotate the substrate W, held by the plurality of chuck pins 6, around the rotational axis A1, and a cylindrical chuck housing 10, housing the spin motor 9.

The plurality of nozzles include a chemical liquid nozzle 11 that discharges a chemical liquid downward. The chemical liquid nozzle 11 is connected to a chemical liquid piping 12, guiding the chemical liquid to be supplied to the chemical liquid nozzle 11. A chemical liquid valve 13, switching between supplying and stopping the supplying of the chemical liquid to the chemical liquid nozzle 11, is interposed in the chemical liquid piping 12. When the chemical liquid valve 13 is opened, the chemical liquid is discharged continuously downward from a discharge port 11p of the chemical liquid nozzle 11.

The chemical liquid to be supplied to the chemical liquid nozzle 11 is, for example, BHF (Buffered Hydrogen Fluoride; a mixed liquid containing HF, $NH_4OH$, and $H_2O$). The chemical liquid is not restricted to BHF and may be a liquid that includes at least one of sulfuric acid, nitric acid, hydrochloric acid, hydrofluoric acid, phosphoric acid, acetic acid, ammonia water, hydrogen peroxide water, an organic acid (for example, citric acid, oxalic acid, etc.), an organic alkali (for example, TMAH: tetramethylammonium hydroxide, etc.), a surfactant, and a corrosion inhibitor.

Although unillustrated, the chemical liquid valve 13 includes a valve body, defining a flow passage, a valve element, disposed in the flow passage, and an actuator, moving the valve element. The same applies to valves described below. The actuator may be a pneumatic actuator or an electric actuator or an actuator besides these. The controller 3 controls the actuator to open and close the chemical liquid valve 13. Also, the controller 3 controls an actuator to change an opening degree of a flow control valve, such as a first supply flow control valve 18, etc.

The chemical liquid nozzle 11 is a scan nozzle that is movable in the chamber 4. The chemical liquid nozzle 11 is connected to a first nozzle moving unit 14 that moves the chemical liquid nozzle 11 in at least either one of a vertical direction or a horizontal direction. The first nozzle moving unit 14 moves the chemical liquid nozzle 11 horizontally between a processing position (position shown in FIG. 1), at which the chemical liquid discharged from the chemical liquid nozzle 11 lands on an upper surface of the substrate W, and a retracted position, at which the chemical liquid nozzle 11 is positioned around the spin chuck 5 in plan view. The processing position includes a central processing position, at which the chemical liquid lands on an upper surface central portion of the substrate W, and an outer peripheral processing position, at which the chemical liquid lands on an upper surface outer peripheral portion of the substrate W.

The plurality of nozzles include a rinse liquid nozzle 15 that discharge a rinse liquid downward. The rinse liquid nozzle 15 is connected to a first rinse liquid piping 16, guiding the rinse liquid to be supplied to the rinse liquid nozzle 15. A first rinse liquid valve 17, switching between supplying and stopping the supplying of the rinse liquid to the rinse liquid nozzle 15, is interposed in the first rinse liquid piping 16. The first supply flow control valve 18, which changes a flow rate of the rinse liquid to be supplied to the rinse liquid nozzle 15, is also interposed in the first rinse liquid piping 16. The rinse liquid nozzle 15 is an example of a first cleaning nozzle and the first rinse liquid piping 16 is an example of a supply piping.

When the first rinse liquid valve 17 is opened, the rinse liquid is discharged continuously downward from a discharge port 15p of the rinse liquid nozzle 15 at a flow rate corresponding to the opening degree of the first supply flow control valve 18. The rinse liquid to be discharged from the rinse liquid nozzle 15 is, for example, pure water (deionized water). The rinse liquid is not restricted to pure water and maybe any of IPA (isopropyl alcohol), electrolyzed ion water, hydrogen water, ozone water, and aqueous hydrochloric acid solution of dilute concentration (for example of approximately 10 to 100 ppm).

The rinse liquid nozzle 15 is a scan nozzle. The rinse liquid nozzle 15 may be a fixed nozzle that is fixed with respect to a bottom portion 4a of the chamber 4. The rinse liquid nozzle 15 is connected to a second nozzle moving unit 19 that moves the rinse liquid nozzle 15 in at least either one of the vertical direction or the horizontal direction. The rinse liquid nozzle 15 may be connected to the first nozzle moving unit 14. The second nozzle moving unit 19 moves the rinse liquid nozzle 15 horizontally between a processing position (position shown in FIG. 1) and a retracted position.

The plurality of nozzles include a lower surface nozzle 20, discharging a processing liquid upward toward a lower surface central portion of the substrate W. The lower surface nozzle 20 is fixed with respect to the bottom portion 4a of the chamber 4. The lower surface nozzle 20 includes a disk portion 20a that is held horizontally at a height between an upper surface of the spin base 7 and a lower surface of the substrate W. The disk portion 20a has a circular annular shape surrounding the rotational axis A1 and has an outer diameter that is smaller than a diameter of the substrate W. A discharge port 20p of the lower surface nozzle 20 opens at an upper surface central portion of the disk portion 20a. The discharge port 20p of the lower surface nozzle 20 faces the lower surface central portion of the substrate W in an up/down direction. The lower surface nozzle 20 is an example of a second cleaning nozzle.

The lower surface nozzle 20 is connected to a second rinse liquid piping 21, guiding a rinse liquid to be supplied to the lower surface nozzle 20. A second rinse liquid valve 22, switching between supplying and stopping the supplying of the rinse liquid to the lower surface nozzle 20, is interposed in the second rinse liquid piping 21. A second supply flow control valve 23, which changes a flow rate of the rinse liquid to be supplied to the lower surface nozzle 20, is also interposed in the second rinse liquid piping 21. When the second rinse liquid valve 22 is opened, the rinse liquid is discharged continuously upward from a discharge port 20p of the lower surface nozzle 20 at a flow rate corresponding to the opening degree of the second supply flow control valve 23. The rinse liquid is, for example, pure water. The rinse liquid may be a rinse liquid other than pure water.

The processing cup 30 includes a plurality of guards 33, catching the liquid expelled outward from the spin chuck 5, a plurality of cups 40, catching the liquid guided downward by the plurality of guards 33, and an outer wall member 31 of circular cylindrical shape that surrounds the plurality of guards 33 and the plurality of cups 40. FIG. 1 shows an example where four guards 33 (a first guard 33A, a second guard 33B, a third guard 33C, and a fourth guard 33D) and three cups 40 (a first cup 40A, a second cup 40B, and a third cup 40C) are provided.

In the following description, each of the first guard 33A, the second guard 33B, the third guard 33C, and the fourth guard 33D is referred to simply as the guard 33. Similarly, each of the first cup 40A, the second cup 40B, and the third cup 40C is referred to simply as the cup 40. Also, "first" may be attached in front of an arrangement corresponding to the first guard 33A. For example, a cylindrical portion 35 corresponding to the first guard 33A may be referred to as the "first cylindrical portion 35." The same applies to arrangements corresponding to the second guard 33B to the fourth guard 33D. That is, for the second guard 33B to the fourth guard 33D, the ordinal number is incremented by one at a time.

The guard 33 is movable in the up/down direction between an upper position, at which an upper end of the guard 33 is positioned higher than the substrate holding position, and a lower position, at which the upper end of the guard 33 is positioned lower than the substrate holding position. A guard elevating/lowering unit 32 moves the plurality of guards in the up/down direction individually. The guard elevating/lowering unit 32 positions the guard 33 at any position from the upper position to the lower position. The guard elevating/lowering unit 32 includes, for example, an electric motor, generating motive power that moves the guard 33 in the up/down direction, and a ball screw and a ball nut that convert the rotation of the electric motor to movement of the guard 33 in the up/down direction.

The guard 33 includes a cylindrical portion 35 of circular cylindrical shape, surrounding the spin chuck 5, and a ceiling portion 34 of circular annular shape, extending obliquely upward from an upper end portion of the cylindrical portion 35 toward the rotation axis A1. The first ceiling portion 34 to the fourth ceiling portion 34 overlap in the up-down direction in the order of the first ceiling portion 34 to the fourth ceiling portion 34 from the lower side. The first cylindrical portion 35 to the fourth cylindrical portion 35 are disposed concentrically in the order of the first cylindrical portion 35 to the fourth cylindrical portion from the inner side. Upper ends of the first ceiling portion 34 to the fourth ceiling portion 34 respectively correspond to the upper ends of the first guard 33A to the fourth guard 33D. The upper ends of the first ceiling portion 34 to the fourth ceiling portion 34 surround the spin base 7 in plan view.

As shown in FIG. 2, each cylindrical portion 35 includes an upper side extension portion 36, extending downward from a lower end portion of the ceiling portion 34. The cylindrical portion 35 of the first guard 33A includes, in addition to the upper side extension portion 36, an intermediate inclining portion of circular annular shape, extending obliquely downward from a lower end portion of the upper side extension portion 36 toward the rotational axis A1, and a lower side extension portion 38 of circular cylindrical shape, extending downward from a lower end portion (inner end portion) of the intermediate inclining portion 37. The cylindrical portion 35 of the third guard 33 includes, in addition to the upper side extension portion 36, an outer side extension portion 39 of circular cylindrical shape, extending downward from the lower end portion of the ceiling portion 34 and surrounding the upper side extension portion 36.

The plurality of cups 40 are disposed concentrically in the order of the first cup 40A, the second cup 40B, and the third cup 40C from the inner side. The first cup 40A surrounds the chuck housing 10. The first cup 40A and the second cup 40B are disposed lower than an upper end of the outer wall member 31. The first cup 40A and the second cup 40B are fixed with respect to the bottom portion 4a of the chamber 4. The third cup 40C is integral with the second guard 33B and moves in the up/down direction together with the second guard 33B. The second guard 33B may be movable with respect to the third cup 40C.

The cup 40 has a U-shaped vertical cross section that is open upward and defines an annular liquid receiving groove 44 that is open upward. The cup 40 includes an inner wall portion 41 of circular cylindrical shape, surrounding the rotational axis A1, an outer wall portion 42 of circular cylindrical shape, surrounding the inner wall portion 41 across an interval, and a bottom wall portion of circular annular shape, connecting lower ends of the inner wall portion 41 and the outer wall portion 42 to each other. A drain port 45 that drains a liquid inside the cup 40 opens at an upper surface of the bottom wall portion 43. The upper surface of the bottom wall portion 43 is inclined obliquely with respect to a horizontal plane so as to become gradually lower as the drain port 45 is approached in a peripheral direction.

An upper end of the inner wall portion 41 may be disposed at a height equal to that of an upper end of the outer wall portion 42 or may be disposed at a position higher than or lower than the upper end of the outer wall portion 42. FIG. 2 shows an example where the upper end of the inner wall portion 41 of the first cup 40A is disposed at a height equal to that of the upper end of the outer wall portion 42 of the first cup 40A, the upper end of the inner wall portion 41 of the second cup 40B is disposed lower than the upper end of the outer wall portion 42 of the second cup 40B, and the upper end of the inner wall portion 41 of the third cup 40C is disposed higher than the upper end of the outer wall portion 42 of the third cup 40C.

The plurality of liquid receiving grooves 44 are respectively positioned under lower end portions of the plurality of cylindrical portions 35. When the guard 33 moves from the upper position to the lower position, the lower end portion of the cylindrical portion 35 enters the liquid receiving groove 44 through an entrance of the liquid receiving groove 44. Specifically, the lower side extension portion 38 of the first guard 33A enters the liquid receiving groove 44 and the upper side extension portions 36 of the second guard 33B and the third guard 33C enter the liquid receiving grooves 44. The lower end portion of the cylindrical portion 35 is thereby disposed in the liquid receiving groove 44 in a state of being separated from the outer wall portion 42 and the inner wall portion 41 in a radial direction and separated from the bottom wall portion 43 in the up/down direction.

As shown in FIG. 2, the plurality of cups 40 are respectively connected to a plurality of drain pipings 46. The second cup 40B is connected to a recovery piping 48 in addition to the drain piping 46. Each of the drain pipings 46 and the recovery piping 48 is an example of an ordinary piping. A restriction piping 50 is connected to each of the first cup 40A, the second cup 40B, and the third cup 40C. The restriction piping 50 includes a plurality of branch pipings 50a, respectively connected to the plurality of drain pipings 46, and a collection piping 50b, connected to the respective branch pipings 50a. Drain valves 47, a recovery valve 49, and a restriction valve 51 are respectively interposed in the drain pipings 46, the recovery piping 48, and the restriction piping 50. The restriction valve 51 and a constricted portion 52 are interposed in the collection piping 50b.

The liquid drained from the cup 40 via the drain port 45 is guided to any of the drain piping 46, the recovery piping 48, and the restriction piping 50 by the three valves, that is, the drain valve 47, the recovery valve 49, and the restriction valve 51 that are included in a drain switching valve. The constricted portion 52 is disposed downstream the restriction valve 51. As long as it is interposed in the collection piping 50b, the constricted portion 52 may be disposed upstream the restriction valve 51. A flow passage area of the constricted portion 52 is smaller than a minimum value of a flow passage area of the drain piping 46 and is smaller than a minimum value of a flow passage area of the recovery piping 48.

The outer wall member 31 and the chuck housing 10 extend upward from the bottom portion 4a of the chamber 4. An annular vat 53, surrounding the spin chuck 5, is defined by the outer wall member 31, the bottom portion 4a of the chamber 4, and the chuck housing 10. A liquid inside the vat 53 is drained into a lower drain piping 55 via a lower drain port 54, opening at the bottom portion 4a of the chamber 4. A flow rate of the liquid flowing in the lower drainpiping 55 is detected by a flow sensor 56.

An exhaust duct 57, guiding a gas exhausted from an interior of the outer wall member 31, extends outward from the outer wall member 31. The gas in the outer wall member 31 is exhausted to the exhaust duct 57. An upstream end of the exhaust duct 57 is disposed lower than the spin base 7. The exhaust duct 57 guides the gas in the chamber 4 toward an exhaust equipment provided in a plant in which the substrate processing apparatus 1 is installed. A flow rate of the exhaust exhausted to the exhaust duct 57 is increased and decreased by an exhaust damper 58. The exhaust damper 58 maybe a manual damper or may be an auto damper.

FIG. 3 is a schematic view showing an outline of processing executed at the substrate processing apparatus 1. FIG. 4 is a block diagram for describing an electrical arrangement of the substrate processing apparatus 1.

As shown in FIG. 3, at the substrate processing apparatus 1, substrate processing of processing a substrate W in the processing unit 2 and chamber cleaning of cleaning an interior of the processing unit 2 are executed. The chamber cleaning is executed after the substrate processing has been performed once or more. The substrate processing is executed again thereafter.

The chamber cleaning may be executed each time a plurality of substrates W are processed at a single processing unit 2, or may be executed each time a single substrate W is processed at the processing unit 2, or may be executed at any timing in accordance with an operation by a user of the substrate processing apparatus 1. Also, the chamber cleaning may be executed when at least either one of a time elapsed from the end of the most recent chamber cleaning or a number of substrates W processed reaches a predetermined value. In this case, as shown in FIG. 4, the controller 3 includes at least either one of a counter 62, counting the number of substrates W, or a timer 63, measuring the time.

As shown in FIG. 4, the controller 3 is a computer that includes a memory 61, storing information of a program, etc., and a processor 60, controlling the substrate processing apparatus 1 in accordance with the information stored in the memory 61. The controller 3 is an example of a liquid amount control unit and a guard position control unit.

The substrate processing and the chamber cleaning are executed by the controller 3 controlling the substrate processing apparatus 1. In other words, the controller 3 is programmed to execute respective processes included in the substrate processing and the chamber cleaning. A recipe, indicating a series of processes included in the substrate processing, is stored in the memory 61. The controller 3 controls the substrate processing apparatus 1 based on the recipe to make the substrate processing apparatus 1 execute the respective processes included in the substrate processing. The chamber cleaning may be incorporated in the recipe.

In the following description, an example of substrate processing and an example of chamber cleaning shall be described. First, the example of substrate processing shall be described.

Figure 5:
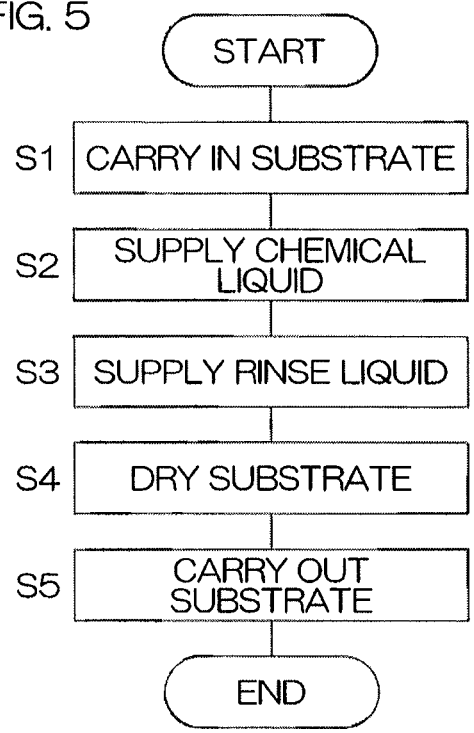
FIG. 5 is a process flowchart for describing an example of substrate processing by which a substrate is processed in the processing unit.
Figure 6A:
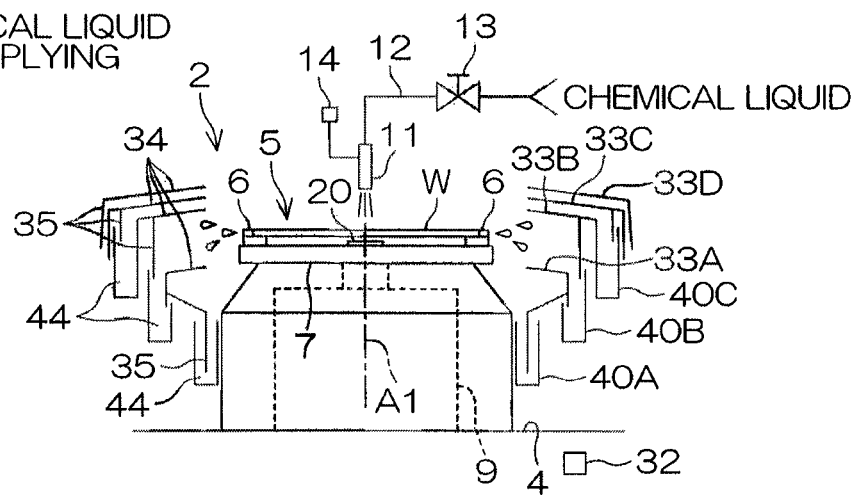
FIG. 6A is a schematic view showing a state of the processing unit when a chemical liquid supplying step is being executed.
Figure 6B:
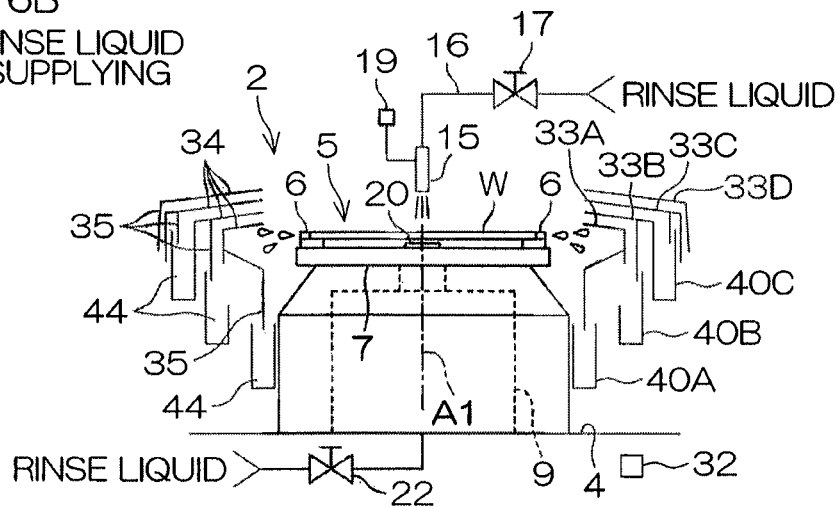
FIG. 6B is a schematic view showing a state of the processing unit when a rinse liquid supplying step is being executed.
Figure 6C:
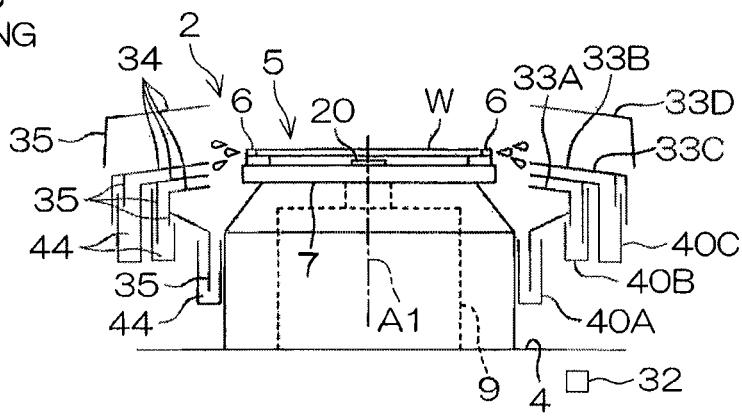
FIG. 6C is a schematic view showing a state of the processing unit when a drying step is being executed.

FIG. 5 is a process flowchart for describing the example of substrate processing. FIG. 6A to FIG. 6C are schematic views showing states of the processing unit 2 when the respective processes shown in FIG. 5 are being executed. FIG. 6A, FIG. 6B, and FIG. 6C are schematic views showing the states of the processing unit 2 when a chemical liquid supplying step, a rinse liquid supplying step, and a drying step are being executed, respectively.

When a substrate W is to be processed by the substrate processing apparatus 1, a carry-instep of carrying the substrate W into the chamber 4 is performed (step S1 of FIG. 5).

Specifically, in a state where all nozzles are retracted from above the spin chuck 5, the transfer robot (not shown) makes a hand enter the chamber 4 while supporting the substrate W by the hand. Thereafter, in a state where a front surface of the substrate W is faced upward, the substrate W on the hand is placed on the spin chuck 5 by the transfer robot. After the substrate W is gripped by the chuck pins 6, the spin motor 9 starts rotating the substrate W. After the substrate W is placed on the spin chuck 5, the transfer robot retracts the hand from an interior of the chamber 4.

Next, as shown in FIG. 6A, the chemical liquid supplying step of supplying the chemical liquid to the upper surface of the substrate W is performed (step S2 of FIG. 5).

Specifically, the first nozzle moving unit 14 moves the chemical liquid nozzle 11 from the retracted position to the processing position. Further, the guard elevating/lowering unit 32 elevates the second guard 33B to the fourth guard 33D to the upper positions while keeping the first guard 33A positioned at the lower position. Thereafter, the chemical liquid valve 13 is opened. The chemical liquid is thereby discharged from the chemical liquid nozzle 11 toward the upper surface of the rotating substrate W. In this process, the first nozzle moving unit 14 may move the chemical liquid nozzle 11 between the central processing position and the outer peripheral processing position or may keep the chemical liquid nozzle 11 still so that a liquid landing position of the chemical liquid is positioned at the upper surface central portion of the substrate W. When a predetermined time elapses from the opening of the chemical liquid valve 13, the chemical liquid valve 13 is closed. Thereafter, the first nozzle moving unit 14 moves the chemical liquid nozzle 11 to the retracted position.

The chemical liquid discharged from the chemical liquid nozzle 11 lands on the upper surface of the substrate W and thereafter flows outward along the upper surface of the rotating substrate W. A liquid film of the chemical liquid that covers an entirety of the upper surface of the substrate W is thereby formed and the chemical liquid is supplied to the entirety of the upper surface of the substrate W. Especially when the first nozzle moving unit 14 moves the chemical liquid nozzle 11 between the central processing position and the outer peripheral processing position, the entirety of the upper surface of the substrate W is scanned by the liquid landing position and therefore the chemical liquid is supplied uniformly to the entirety of the upper surface of the substrate W. The upper surface of the substrate W is thereby processed uniformly.

When the chemical liquid nozzle 11 is discharging the chemical liquid, an inner surface of the second guard 33B faces the substrate W directly in the horizontal direction. The chemical liquid expelled outward from the substrate W enters a space between the first guard 33A and the second guard 33B. Thereafter, the chemical liquid is guided toward the second cup 40B by at least either one of the first guard 33A or the second guard 33B and flows down into the liquid receiving groove 44 of the second cup 40B. In this process, the drain valves 47 and the restriction valve 51 are closed and the recovery valve 49 is open (see FIG. 2). The chemical liquid in the second cup 40B is thus drained via the drain port 45 into the recovery piping 48 and is guided to a recovery tank. A lower end portion of the second guard 33B is positioned above a surface of the chemical liquid in the second cup 40B.

Next, as shown in FIG. 6B, a rinse liquid supplying step of supplying pure water, which is an example of the rinse liquid, to both the upper surface and the lower surface of the substrate W is performed (step S3 of FIG. 5).

Specifically, the second nozzle moving unit 19 moves the rinse liquid nozzle 15 from the retracted position to the processing position. Further, the guard elevating/lowering unit 32 elevates the first guard 33A to the upper position while keeping the second guard 33B to the fourth guard 33D positioned at the upper positions. Thereafter, the first rinse liquid valve 17 is opened and the rinse liquid nozzle 15 begins to discharge the pure water. The pure water is thereby discharged from the rinse liquid nozzle 15 toward the upper surface of the rotating substrate W. In this process, the second nozzle moving unit 19 may move the rinse liquid nozzle 15 between the central processing position and the outer peripheral processing position or may keep the rinse liquid nozzle 15 still so that a liquid landing position of the rinse liquid is positioned at the upper surface central portion of the substrate W.

The pure water that lands on the upper surface of the substrate W flows outward along the upper surface of the substrate W. The chemical liquid on the substrate W is rinsed off by the pure water discharged from the rinse liquid nozzle 15. A liquid film of the pure water that covers the entirety of the upper surface of the substrate W is thereby formed. The pure water that reaches an upper surface outer peripheral portion of the substrate W scatters from the substrate W to its periphery and is caught by the first guard 33A. Thereafter, the pure water is guided toward the first cup 40A by the first guard 33A and flows down into the liquid receiving groove 44 of the first cup 40A. When a predetermined time elapses from the opening of the first rinse liquid valve 17, the first rinse liquid valve 17 is closed and the discharge of pure water is stopped. Thereafter, the second nozzle moving unit 19 moves the rinse liquid nozzle 15 to the retracted position.

Meanwhile, the second rinse liquid valve 22 is opened and the lower surface nozzle 20 begins to discharge the pure water. The pure water is thereby discharged from the lower surface nozzle 20 toward the lower surface central portion of the rotating substrate W. The second rinse liquid valve 22 may be opened at the same time as the first rinse liquid valve 17 or may be opened before or after the first rinse liquid valve 17 is opened. The pure water that lands on the lower surface of the substrate W flows outward along the lower surface of the substrate W and scatters from an outer peripheral portion of the substrate W to its periphery. A mist, etc., of the chemical liquid that is attached to the lower surface of the substrate W is rinsed off by the pure water discharged from the lower surface nozzle 20. When a predetermined time elapses from the opening of the second rinse liquid valve 22, the second rinse liquid valve 22 is closed and the discharge of pure water is stopped.

Next, as shown in FIG. 6C, the drying step of drying the substrate W by rotating the substrate W at high speed is performed (step S4 of FIG. 5).

Specifically, the guard elevating/lowering unit 32 lowers the first guard 33A to the third guard 33C to the lower positions while keeping the fourth guard 33D positioned at the upper position. Thereafter, the spin motor 9 accelerates the substrate W in a rotation direction and rotates it at a high rotational speed (for example, of several thousand rpm). A large centrifugal force is thereby applied to the liquid attached to the substrate W and the liquid is scattered from the substrate W to its periphery. The liquid is thus removed from the substrate W and the substrate W dries. When a predetermined time elapses from the start of high-speed rotation of the substrate W, the spin motor stops rotating. The rotation of the substrate W is thereby stopped.

Next, a carry-out step of carrying the substrate W out from the chamber 4 is performed (step S5 of FIG. 5).

Specifically, the guard elevating/lowering unit 32 lowers the fourth guard 33D to the lower position while keeping the first guard 33A to the third guard 33C positioned at the lower positions. Thereafter, the transfer robot (not shown) makes the hand enter the chamber 4. After the holding of the substrate W by the plurality of chuck pins 6 is released, the transfer robot supports the substrate W on the spin chuck 5 with the hand. Thereafter, the transfer robot retracts the hand from the interior of the chamber 4 while supporting the substrate W with the hand. The processed substrate W is thereby carried out from the chamber 4.

An example of chamber cleaning shall now be described.

Figure 9:
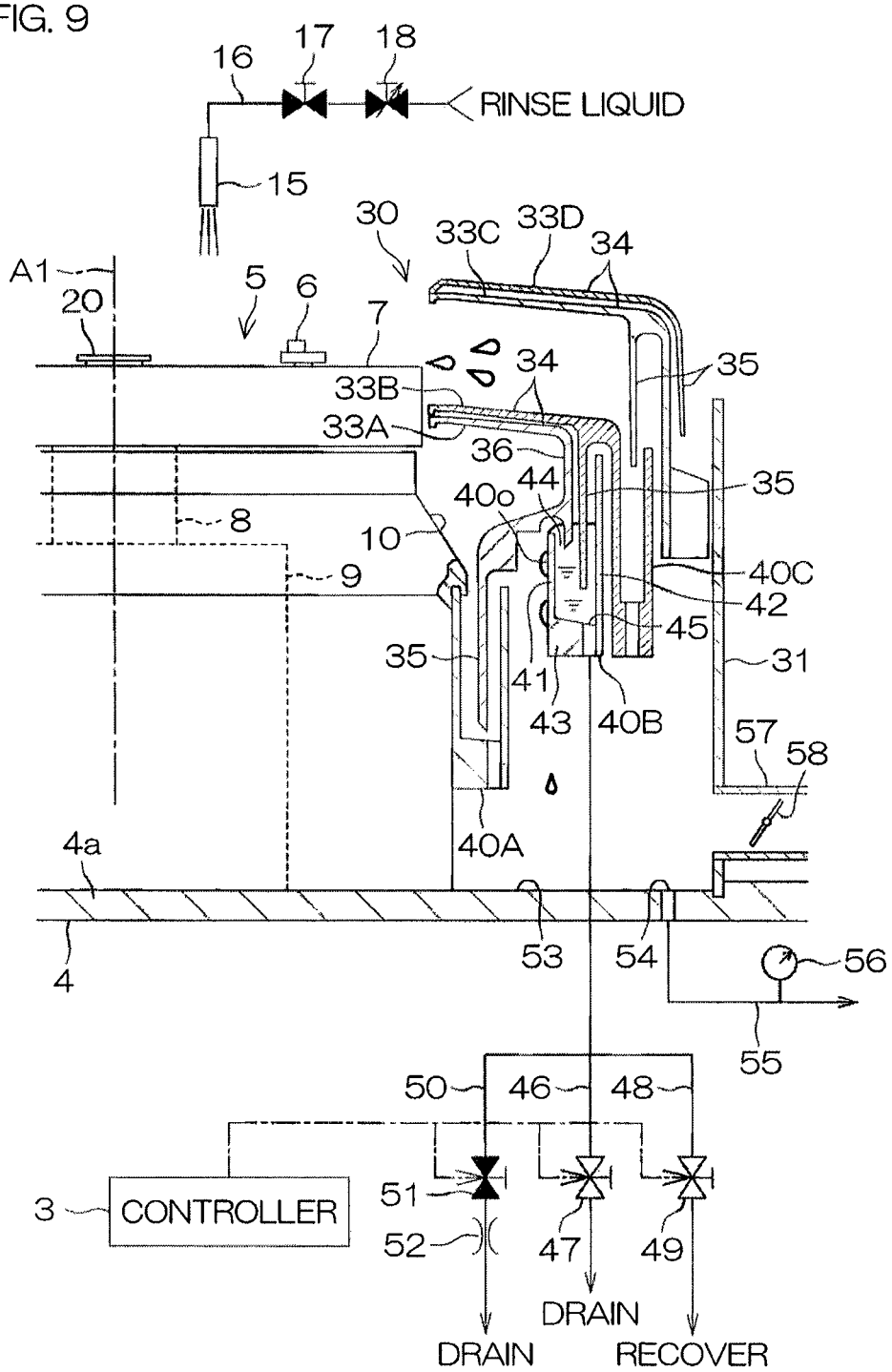
FIG. 9 is a schematic view showing a state where a lower end portion of a second guard is immersed in the pure water in the second cup.
Figure 10:
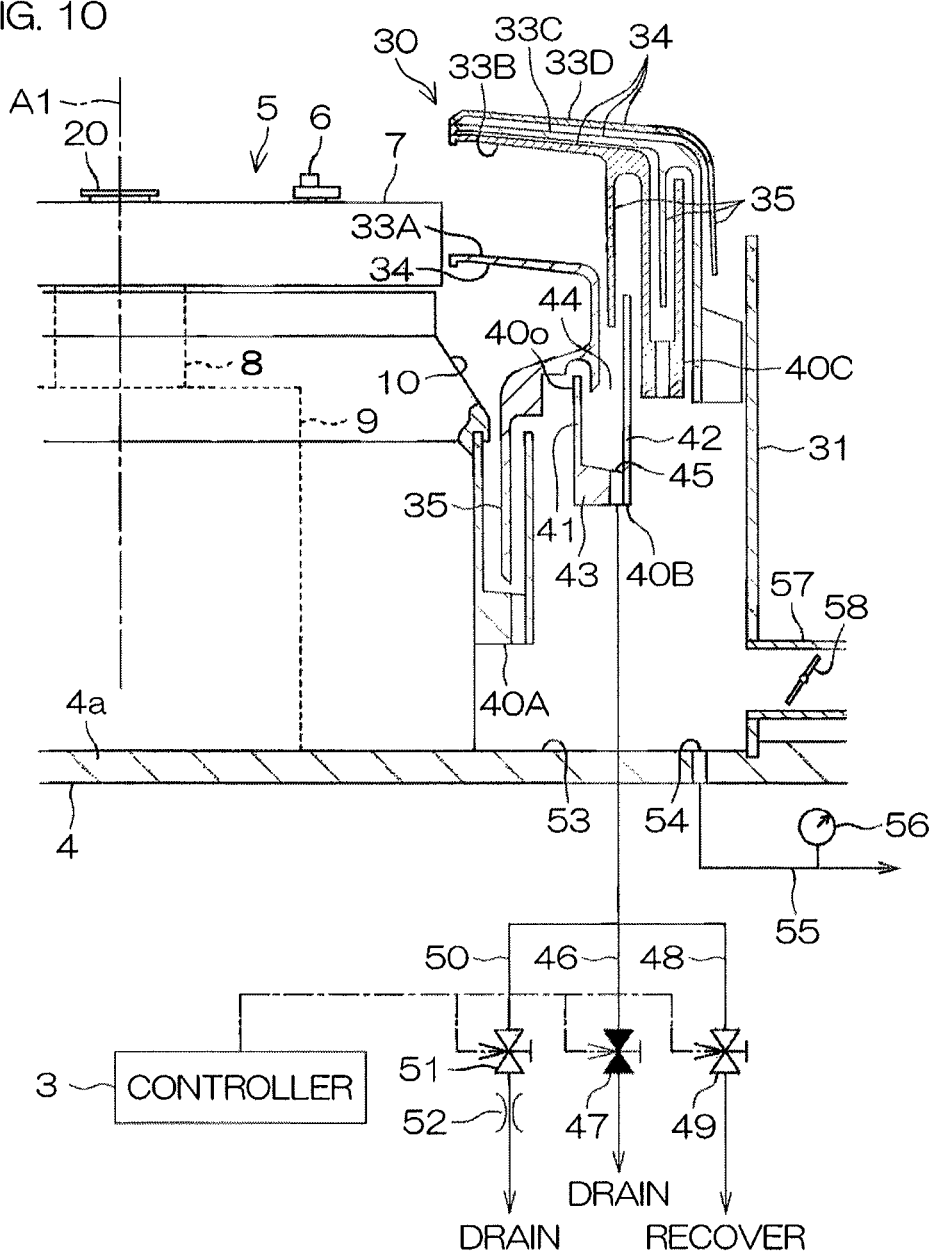
FIG. 10 is a schematic view showing a state where the pure water is drained from the second cup via a drain port.

FIG. 7 is a process flowchart for describing the example of chamber cleaning. FIG. 8 is a schematic view showing a state where pure water, which is an example of a cleaning liquid, is accumulated in the second cup 40B. FIG. 9 is a schematic view showing a state where the lower end portion of the second guard 33B is immersed in the pure water in the second cup 40B. FIG. 10 is a schematic view showing a state where the pure water is drained from the second cup 40B via the drain port 45. In FIG. 8 to FIG. 10, an open valve is indicated in black and a closed valve is indicated in white.

As shown in FIG. 8, when the second guard 33B is to be cleaned, the controller 3 makes the second guard 33B to the fourth guard 33D be positioned at the upper positions and makes the first guard 33A be positioned at the lower position (step S11 of FIG. 7). Further, the controller 3 makes the rinse liquid nozzle 15 be positioned above the spin base 7 and makes the spin base 7 rotate (step S12 of FIG. 7). In this state, the controller 3 makes the rinse liquid nozzle 15 discharge the pure water, which is the example of the cleaning liquid (step S13 of FIG. 7)

The pure water discharged from the rinse liquid nozzle 15 lands on the upper surface of the spin base 7 and spreads outward along the upper surface of the spin base 7. The pure water that reaches an outer peripheral portion of the spin base 7 is scattered from the spin base 7 to its periphery and enters the space between the first guard 33A and the second guard 33B. The pure water is guided toward the second cup 40B by at least either one of an outer surface of the first guard 33A or the inner surface of the second guard 33B and flows down into the liquid receiving groove 44 of the second cup 40B.

While the pure water continues to be supplied to the second cup 40B, the pure water in the second cup 40B is drained via the drain port 45. As shown in FIG. 8, in this process, the drain valve 47 and the recovery valve 49 are closed and the restriction valve 51 is opened by the controller 3. A flow rate of the pure water supplied to the second cup 40B is greater than a flow rate of the pure water drained from the second cup 40B via the drain port 45. The pure water thus accumulates in the second cup 40B and a surface (upper surface) of the pure water in the second cup 40B rises gradually.

When the pure water in the second cup 40B increases, a liquid level, that is, the surface of the pure water rises. Accordingly, an area of a region of an outer peripheral surface of the inner wall portion 41 of the second cup 40B in direct contact with the pure water increases. Similarly, an area of a region of an inner peripheral surface of the outer wall portion 42 of the second cup 40B in direct contact with the pure water increases. In other words, the pure water directly contacts regions that are unlikely to come in contact with the pure water unless the pure water is proactively accumulated in the second cup 40B. With the second cup 40B, the inner wall portion 41 is sufficiently lower than the outer wall portion 42 such that the pure water directly contacts an entirety of the outer peripheral surface of the inner wall portion 41.

As shown in FIG. 9, the pure water that overflows from the entrance of liquid receiving groove 44 flows downward along an outer surface 40o of the second cup 40B that includes the inner peripheral surface of the inner wall portion 41 and the outer peripheral surface of the outer wall portion 42 and flows down onto a bottom surface of the vat 53. The pure water on the vat 53 is drained via the lower drain port 54 into the lower drain piping 55. Based on a detection value of the flow sensor 56, the controller 3 judges whether or not the second cup 40B is filled with the pure water, that is, whether or not the surface of the pure water has reached the entrance of the liquid receiving groove 44.

When the second cup 40B is filled with the pure water, the controller 3 makes the second guard 33B be lowered from the upper position, corresponding to a cleaning upper position, to the lower position, corresponding to a cleaning lower position (step S14 of FIG. 7). Before the second guard 33B reaches the lower position, the lower end portion of the second cylindrical portion 35 is immersed in the pure water in the second cup 40B and the pure water overflows from the second cup 40B. As shown in FIG. 9, with the second cup 40B, the inner wall portion 41 is sufficiently lower than the outer wall portion 42 and therefore the pure water in the second cup 40B is drained upon passing just above the inner wall portion 41.

The controller 3 makes the second guard 33B be lowered to the lower position while letting the pure water in the second cup 40B overflow. When the second guard 33B reaches the lower position, the controller 3 makes the second guard 33B ascend from the lower position to the upper position. In this process, the lower end portion of the second cylindrical portion 35 moves upward inside the pure water in the second cup 40B. And before the second guard 33B reaches the upper position, the lower end portion of the second cylindrical portion 35 passes upward through the surface of the pure water in the second cup 40B and exits out of the liquid receiving groove 44 of the second cup 40B.

The rotation of the spin base 7 and the discharge of pure water from the rinse liquid nozzle 15 are sustained not only while the second guard 33B is being lowered toward the lower position but also while the second guard 33B is being elevated toward the upper position. The pure water in the second cup 40B overflows from the entrance of the liquid receiving groove 44 during at least a portion of the period in which the lower end portion of the second cylindrical portion 35 is rising in the pure water in the second cup 40B. When the second guard 33B reaches the upper position, the controller 3 makes the second cup 40 be lowered again to the lower position. That is, the controller 3 makes the second guard 33B reciprocate a plurality of times between the upper position and the lower position (step S14 of FIG. 7).

As shown in FIG. 9, when the pure water in the second cup 40B increases, the lower end portion of the cylindrical portion 35 of the first guard 33A which is positioned at the lower position, that is, the lower end portion of the upper side extension portion 36 is immersed in the pure water in the second cup 40B. An inner peripheral surface, an outer peripheral surface, and a lower surface of the lower end portion of the upper side extension portion 36 thus come indirect contact with the pure water in the second cup 40B. In this process, the controller 3 may keep the first guard 33A still constantly at the lower position or may make the first guard 33A reciprocate a plurality of times between the upper position and the lower position as in the case of the second guard 33B.

When a predetermined time elapses from the start of cleaning of the second guard 33B, the controller 3 stops the rotation of the spin base 7 and the discharge of pure water from the rinse liquid nozzle 15 to end the cleaning of the second guard 33B (step S15 and step S16 of FIG. 7). Further, as shown in FIG. 10, the controller 3 closes the restriction valve 51 and opens the drain valve 47. The flow rate of the pure water drained from the second cup 40B via the drain port 45 is thereby increased. The pure water in the second cup 40B is thus drained rapidly and almost all of the pure water is eliminated from the second cup 40B (step S17 of FIG. 7). The pure water drained from the second cup 40B via the drain port 45 may be reused or may be discarded.

The pure water discharged from the rinse liquid nozzle 15 thus flows outward along the upper surface of the rotating spin base 7. The chemical liquid attached to the spin base 7 and the chuck pins 6 is rinsed off by the pure water. Further, the pure water is supplied directly not just to the spin base 7 and the chuck pins 6 but also to the outer surface of the first guard 33A, including an upper surface of the first ceiling portion 34 and an outer peripheral surface of the first cylindrical portion 35, and the inner surface of the second guard 33B, including a lower surface of the second ceiling portion 34 and an inner peripheral surface of the second cylindrical portion 35. The outer surface of the first guard 33A and the inner surface of the second guard 33B are thereby cleaned.

When other locations, such as an inner surface of the first guard 33A, etc., are to be cleaned, operations are performed as in the case described above with the exception of the positions of the first guard 33A to the fourth guard 33D. Specifically, when the inner surface of the first guard 33A is to be cleaned, the first guard 33A to the fourth guard 33D are disposed at the upper positions. When an outer surface of the second guard 33B and an inner surface of the third guard 33C are to be cleaned, the first guard 33A and the second guard 33B are disposed at the lower positions and the third guard 33C and the fourth guard 33D are disposed at the upper positions.

When the inner surface of the first guard 33A is to be cleaned, the pure water may be accumulated in the first cup 40A and the lower end portion of the cylindrical portion 35 of the first guard 33A may be immersed in the pure water in the first cup 40A as is done with the second guard 33B and the second cup 40B. Similarly, the lower end portion of the cylindrical portion 35 of the third guard 33C may be immersed in the pure water in the third cup 40C. By doing so, the amount of chemical liquid, etc., remaining on the first guard 33A and the third guard 33C can be reduced as well.

As described above, with the present preferred embodiment, the pure water is accumulated in the liquid receiving groove 44 of the second cup 40B. Thereafter, the lower end portion of the second cylindrical portion 35, that is, the lower end portion of the cylindrical portion 35 of the second guard 33B is immersed in the pure water in the second cup 40B. Not just the inner peripheral surface of the lower end portion of the second cylindrical portion 35 but the lower surface and the outer peripheral surface of the lower end portion of the second cylindrical portion 35 are thereby also put in direct contact with the pure water in the second cup 40B. The chemical liquid of minute amount and crystals of the chemical liquid are thus removed from the lower surface and the outer peripheral surface of the lower end portion of the second cylindrical portion 35 and the lower end portion of the second cylindrical portion 35 is cleaned. Contaminants remaining on the second guard 33B can thereby be lessened.

With the present preferred embodiment, the second lower end portion moves in the up-direction inside the pure water in the second cup 40B. The chemical liquid of minute amount and the crystals of the chemical liquid that are attached to the lower end portion of the second cylindrical portion 35 can thereby be removed effectively.

With the present preferred embodiment, the lower end portion of the second cylindrical portion 35 passes through the surface (upper surface) of the pure water in the second cup 40B a plurality of times in the up/down direction. When the lower end portion of the second cylindrical portion 35 exits upward from the surface of the pure water, a surface tension of the pure water pulls down the crystals of the chemical liquid attached to the lower end portion of the second cylindrical portion 35. Also, when the lower end portion of the second cylindrical portion 35 enters the surface of the pure water, an impact is applied to the crystals of the chemical liquid attached to the lower end portion of the second cylindrical portion 35. The crystals of the chemical liquid can thus be removed effectively from the lower end portion of the second cylindrical portion 35.

With the present preferred embodiment, the pure water in the second cup 40B is drained via the drain port 45 while the lower end portion of the second cylindrical portion 35 is immersed in the pure water in the second cup 40B. The chemical liquid and the crystals of the chemical liquid removed from the lower end portion of the second cylindrical portion 35 move out of the liquid receiving groove 44 together with the pure water drained from the liquid receiving groove 44 via the drain port 45. The chemical liquid and the crystals of the chemical liquid are thus unlikely to reattach to the lower end portion of the second cylindrical portion 35. Contaminants remaining on the second guard 33B can thereby be lessened.

With the present preferred embodiment, the pure water in the second cup 40B overflows from the entrance of the liquid receiving groove 44 provided at an upper end of the liquid receiving groove 44. When the lower end portion of the second cylindrical portion 35 is immersed in the pure water in the second cup 40B, the chemical liquid and the crystals of the chemical liquid are mixed in the pure water in the second cup 40B. The chemical liquid, etc., present near the surface of the pure water in the second cup 40B are drained out of the liquid receiving groove 44 together with the pure water overflowing from the liquid receiving groove 44. The chemical liquid and the crystals of the chemical liquid are therefore unlikely to reattach to the lower end portion of the second cylindrical portion 35. Contaminants remaining on the second guard 33B can thereby be lessened.

A volume of the portion of the second cylindrical portion 35 that is inside the pure water decreases when the lower end portion of the second cylindrical portion 35 is rising inside the pure water and therefore the surface of the pure water will continue to be lowered unless the pure water is supplied to the liquid receiving groove 44. With the present preferred embodiment, the pure water is supplied to the liquid receiving groove 44 at a high flow rate such that the pure water overflows from the liquid receiving groove 44 even in such a case. The chemical liquid, etc., mixed in the pure water in the second cup 40B can thus be drained reliably together with the pure water overflowing from the liquid receiving groove 44.

With the present preferred embodiment, the pure water that overflowed from the second cup 40B flows downward along the outer surface 40o of the second cup 40B that includes the inner peripheral surface of the inner wall portion 41 and the outer peripheral surface of the outer wall portion 42. Although the chemical liquid used for processing the substrate W is unlikely to directly contact the outer surface 40o of the second cup 40B, a mist or liquid droplets of the chemical liquid may contact the outer surface 40o of the second cup 40. Therefore, by making the pure water contact the outer surface 40o of the second cup 40B directly, the chemical liquid and the crystals of the chemical liquid attached to the outer surface 40o of the second cup 40 can be removed.

With the present preferred embodiment, the pure water that overflowed from the second cup 40B is caught by the vat 53, positioned below the second cup 40B, and is drained from the vat 53 into the lower drain piping 55 via the lower drain port 54. When the pure water overflows from the second cup 40B, the flow rate of the liquid flowing through the lower drain piping 55 changes. Whether or not the pure water overflowed from the second cup 40B is judged based on the detection value of the flow sensor 56 that detects the flow rate of the liquid flowing through the lower drain piping 55. The pure water overflowed from the second cup 40B can thus be detected reliably.

With the present preferred embodiment, the drain switching valves, including the drain valve 47, the recovery valve 49, and the restriction valve 51, are switched from ordinary states to restriction states to accumulate the pure water in the second cup 40B. The pure water in the second cup 40B is drained, not into the drain piping 46 and the recovery piping 48 but into the restriction piping 50. The flow passage area of the constricted portion 52 interposed in the restriction piping 50 is smaller than the minimum values of the flow passage areas of the drain piping 46 and the recovery piping 48. The flow rate (drain flow rate) of the liquid drained from the second cup 40B via the drain port 45 is thereby made less than the flow rate (supply flow rate) of the pure water supplied to the liquid receiving groove 44 of the second cup 40 and the pure water accumulates in the second cup 40.

The present invention is not restricted to the contents of the above described preferred embodiments and various modifications are possible.

For example, the cleaning liquid that cleans the processing cup 30 may be a liquid other than pure water. For example, carbonated water may be used in place of pure water as the cleaning liquid.

That is, when the crystals of the chemical liquid that are attached to the processing cup 30 are water-soluble, the cleaning liquid is preferably a water-containing liquid having water as a main component (a liquid with a water content of, for example, 80%). Pure water and carbonated water are each an example of a water-containing liquid. Also, when the crystals of the chemical liquid that are attached to the processing cup 30 are water-repellent, it is preferable for the cleaning liquid to be a liquid of an organic solvent, such as IPA.

When the lower end portion of the second cylindrical portion 35 is to be immersed in the pure water in the second cup 40B, the lower end portion of the second cylindrical portion 35 may be kept still in the pure water in the second cup 40B or the second guard 33B may be vibrated in the up-down direction with the lower end portion of the second cylindrical portion 35 being kept immersed in the pure water in the second cup 40B.

When the lower end portion of the second cylindrical portion 35 is to be immersed in the pure water in the second cup 40B, the second guard 33B may be elevated and lowered at two positions differing from the upper position and the lower position. That is, the cleaning upper position and the cleaning lower position maybe positions differing from the upper position and the lower position. In this case, the cleaning upper position may be a position at which the lower end portion of the second cylindrical portion 35 is immersed in the pure water in the second cup 40B.

In order to accumulate the pure water in the second cup 40B, the pure water may be supplied to the second cup 40B while stopping the draining of pure water to the drain port 45. That is, the pure water may be supplied to the second cup 40B in a state where the drain valve 47, the recovery valve 49, and the restriction valve 51 are closed. In this case, pure water with a comparatively high chemical liquid content is supplied to the second cup 40B at the start of supplying of the pure water, and therefore the pure water in the second cup 40B may be discarded just at the start of supplying of the pure water and the draining of the pure water from the drain port 45 may be stopped thereafter.

Whether or not the pure water overflowed from the second cup 40B may be judged based on the time elapsed from the start of supplying of the pure water to the second cup 40B. Or, whether or not the pure water overflowed from the second cup 40B may be judged based on a detection value of a level gauge that detects a height of the surface of the pure water in the second cup 40B.

The lower end portion of the second cylindrical portion 35 may be immersed in the pure water in the second cup 40B before the pure water overflows from the second cup 40B.

The pure water does not have to be made to overflow from the second cup 40B when immersing the lower end portion of the second cylindrical portion 35 in the pure water in the second cup 40B.

Figure 11:
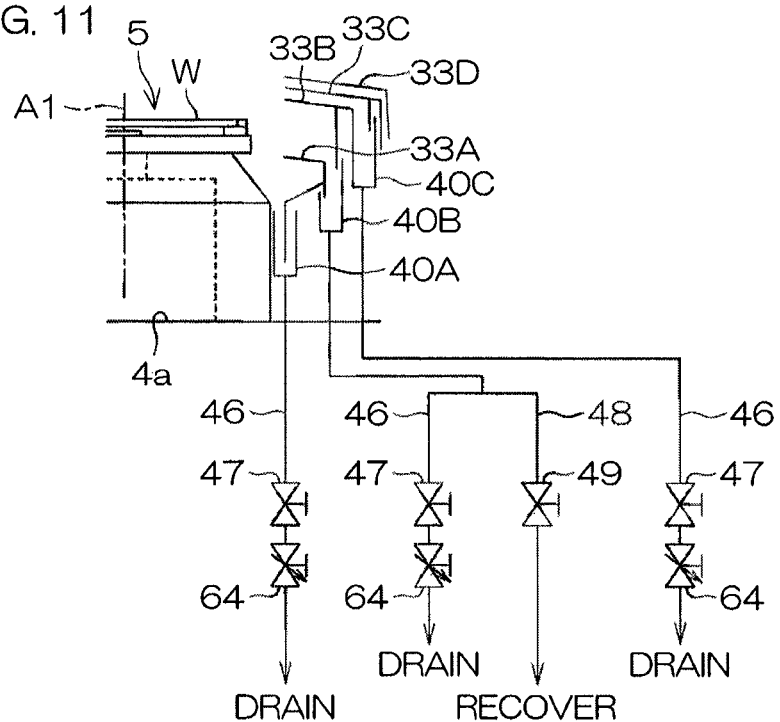
FIG. 11 is a schematic view for describing a draining system according to another preferred embodiment of the present invention.

As shown in FIG. 11, the restriction piping 50 (see FIG. 2) may be omitted and a drain flow control valve 64 may be provided in at least one of the plurality of drain pipings 46. Or, in place of the constricted portion 52 (see FIG. 2), the drain flow control valve 64 may be provided in the restriction piping 50. In either case, the flow rate (drain flow rate) of the liquid drained from the cup 40 via the drain port 45 can be changed by changing an opening degree of the drain flow control valve 64.

Although a case where the restriction piping 50 is connected to each of the first cup 40A, the second cup 40B, and the third cup 40C was described, the restriction piping 50 may be connected to just the cup 40 to which the chemical liquid is supplied, that is, to just the second cup 40B.

When the pure water is to be accumulated in the second cup 40B, the flow rate (supply flow rate) of the pure water supplied to the liquid receiving groove 44 of the second cup 40B may be increased so that the supply flow rate exceeds the flow rate (drain flow rate) of the pure water drained from the second cup 40B via the drain port 45.

Specifically, the supply flow rate may be increased by increasing the opening degree of the first supply flow control valve 18. Or, when the pure water is to be accumulated in the second cup 40B, both the rinse liquid nozzle 15 and the lower surface nozzle 10 may be made to discharge the pure water. In this case, the supply flow rate is increased by just the flow rate of pure water discharged from the lower surface nozzle 20.

When the processing cup 30 is to be cleaned, the lower surface nozzle 20 may be made to discharge the pure water in place of the rinse liquid nozzle 15.

Figure 12:
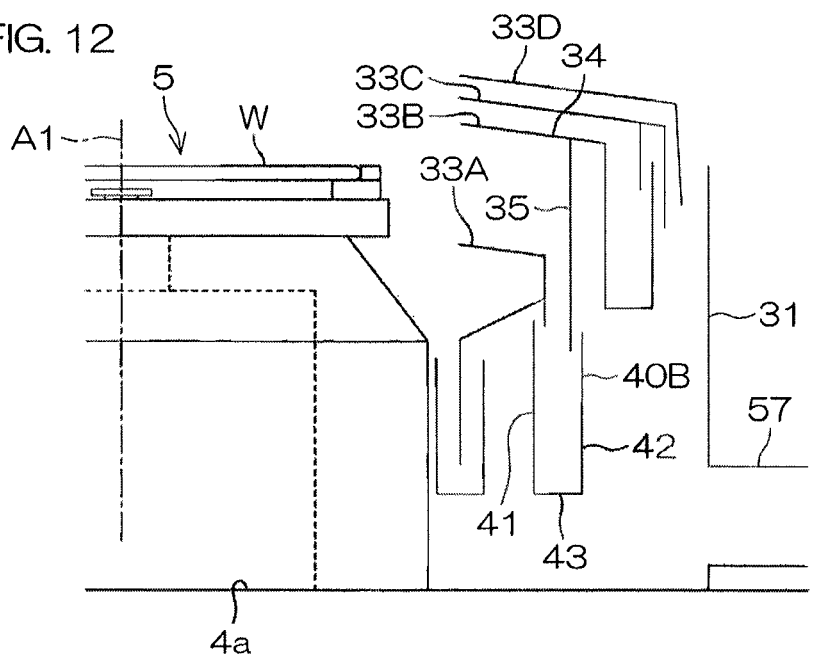
FIG. 12 is a schematic view showing a vertical cross section of a second cup according to yet another preferred embodiment of the present invention.
Figure 13:
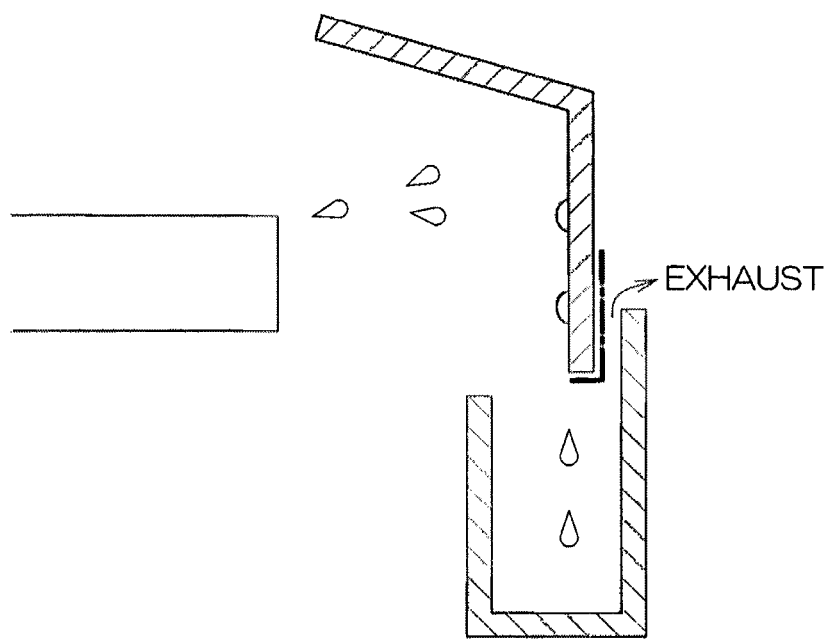
FIG. 13 is a schematic view for describing problems of a conventional art.

As shown in FIG. 12, the upper end of the outer wall portion 42 of the second cup 40B may be disposed lower than the upper end of the inner wall portion 41 of the second cup 40B. In this case, the pure water that overflowed from the second cup 40B flows downward along an outer peripheral surface of the upper end portion of the outer wall portion 42. The outer peripheral surface of the upper end portion of the outer wall portion 42 defines a passage for the exhaust flowing toward the exhaust duct 57. A mist of the chemical liquid attaches readily to the outer peripheral surface of the upper end portion of the outer wall portion 42. The chemical liquid and the crystals of the chemical liquid remaining on the processing cup 30 can thus be lessened effectively.

The number of the guards 33 included in the processing cup 30 may be any of one to three or may be five or more. The number of the cups 40 included in the processing cup 30 may be either one or two or may be four or more.

The spin chuck 5 is not restricted to a clamping type chuck, in which the plurality of chuck pins 6 are brought into contact with the outer peripheral surface of the substrate W, and may be a vacuum type chuck, in which a rear surface (lower surface) of the substrate W that is a non-device defining surface is suctioned onto an upper surface of the spin base 7 to hold the substrate W horizontally.

The substrate processing apparatus 1 is not limited to an apparatus that processes a disk-shaped substrate W and may be an apparatus that processes a polygonal substrate W such as a substrate for a liquid crystal display.

Two or more of any of the arrangements described above may be combined. Two or more of any of the steps described above may be combined.

The present application corresponds to Japanese Patent Application No. 2016-141463 filed in the Japan Patent Office on Jul. 19, 2016 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
   a substrate holding unit, rotating a substrate around a vertical rotational axis passing through a central portion of the substrate while holding the substrate horizontally;
   a chemical liquid nozzle, discharging a chemical liquid toward the substrate held by the substrate holding unit;
   a guard of cylindrical shape, including a cylindrical portion that surrounds the substrate held by the substrate holding unit, and catching liquid scattered outward from the substrate holding unit;
   a cup of annular shape, defining a liquid receiving groove of annular shape positioned below the cylindrical portion, and catching liquid, guided downward by the guard, by the liquid receiving groove;
   a guard elevating/lowering unit, moving the guard in an up/down direction;
   a cleaning liquid supplying unit, including a first cleaning liquid nozzle that discharges a cleaning liquid, differing from the chemical liquid, from a discharge port disposed above or below the substrate held by the substrate holding unit, and supplying the cleaning liquid, discharged from the first cleaning liquid nozzle, to the liquid receiving groove via the substrate holding unit and the guard;
   a cleaning liquid draining unit, draining the cleaning liquid, in the liquid receiving groove, via a drain port provided in the liquid receiving groove;
   a liquid amount control unit, controlling the cleaning liquid supplying unit and the cleaning liquid draining unit to accumulate the cleaning liquid in the liquid receiving groove and to cause the cleaning liquid in the liquid receiving groove to overflow from an entrance of the liquid receiving groove at least either when a lower end portion of the cylindrical portion is immersed in the cleaning liquid in the liquid receiving groove or when the lower end portion of the cylindrical portion is not immersed in the cleaning liquid in the liquid receiving groove;
   a vat, positioned below the cup and catching the cleaning liquid that overflowed from the entrance of the liquid receiving groove;
   a lower drain piping, guiding the cleaning liquid, drained from the vat via a lower drain port provided in the vat; and
   a guard position control unit, controlling the guard elevating/lowering unit to cause the lower end portion of the cylindrical portion to be immersed in the cleaning liquid in the liquid receiving groove.

2. The substrate processing apparatus according to claim 1, wherein the guard position control unit causes the lower end portion of the cylindrical portion to vibrate in the up/down direction while causing the lower end portion of the cylindrical portion to be immersed in the cleaning liquid in the liquid receiving groove.

3. The substrate processing apparatus according to claim 1, wherein the guard position control unit causes the guard to reciprocate a plurality of times in the up/down direction between a cleaning upper position, at which the lower end portion of the cylindrical portion is positioned above the cleaning liquid in the liquid receiving groove, and a cleaning lower position, at which the lower end portion of the cylindrical portion is immersed in the cleaning liquid in the liquid receiving groove.

4. The substrate processing apparatus according to claim 1, wherein the liquid amount control unit causes the cleaning liquid in the liquid receiving groove to be drained via the drain port when the lower end portion of the cylindrical portion is immersed in the cleaning liquid in the liquid receiving groove.

5. The substrate processing apparatus according to claim 1, wherein the liquid amount control unit causes the cleaning liquid in the liquid receiving groove to overflow from the entrance of the liquid receiving groove when the lower end portion of the cylindrical portion is rising inside the cleaning liquid in the liquid receiving groove.

6. The substrate processing apparatus according to claim 1, wherein the cup includes an outer surface downwardly guiding the cleaning liquid that overflowed from the entrance of the liquid receiving groove.

7. The substrate processing apparatus according to claim 1, wherein
   the substrate processing apparatus further comprises a flow sensor, detecting a flow rate of a liquid flowing through the lower drain piping; and
   the liquid amount control unit judges, based on a detection value of the flow sensor, whether or not the cleaning liquid overflowed from the liquid receiving groove.

8. The substrate processing apparatus according to claim 1, wherein the cleaning liquid draining unit decreases a drain flow rate that represents a flow rate of the cleaning liquid drained from the liquid receiving groove via the drain port, to make the drain flow rate less than a supply flow rate that represents a flow rate of the cleaning liquid supplied from the first cleaning liquid nozzle to the liquid receiving groove via the substrate holding unit and the guard.

9. The substrate processing apparatus according to claim 8, wherein the cleaning liquid draining unit includes
   an ordinary piping, guiding the cleaning liquid drained from the liquid receiving groove via the drain port;
   a restriction piping, guiding the cleaning liquid drained from the liquid receiving groove via the drain port;
   a constricted portion, interposed in the restriction piping and having a flow passage area smaller than a minimum value of a flow passage area of the ordinary piping, and
   a drain switching valve, switched between an ordinary state, in which the cleaning liquid in the liquid receiving groove is drained into the ordinary piping, and a restriction state, in which the cleaning liquid in the liquid receiving groove is drained into the restriction piping.

10. The substrate processing apparatus according to claim 8, wherein the cleaning liquid draining unit includes an ordinary piping, guiding the cleaning liquid drained from the liquid receiving groove via the drain port, and a drain flow control valve, changing a flow rate of a liquid flowing in the ordinary piping.

11. The substrate processing apparatus according to claim 1, wherein the cleaning liquid supplying unit increases a supply flow rate that represents a flow rate of the cleaning liquid supplied from the first cleaning liquid nozzle to the liquid receiving groove via the substrate holding unit and the guard, to make the supply flow rate greater than a drain flow rate that represents a flow rate of the cleaning liquid drained from the liquid receiving groove via the drain port.

12. The substrate processing apparatus according to claim 11, wherein the cleaning liquid supplying unit includes a supply piping, guiding the cleaning liquid to be supplied to the first cleaning liquid nozzle, and a supply flow control valve, changing a flow rate of a liquid flowing in the supply piping.

13. The substrate processing apparatus according to claim 11, wherein the cleaning liquid supplying unit includes a second cleaning liquid nozzle differing from the first cleaning liquid nozzle and discharging a cleaning liquid from a discharge port disposed above or below the substrate held by the substrate holding unit.

* * * * *